(12) United States Patent
Youn et al.

(10) Patent No.: US 11,437,320 B2
(45) Date of Patent: Sep. 6, 2022

(54) SEMICONDUCTOR DEVICES

(71) Applicant: Samsung Electronics Co., Ltd., Suwon-si (KR)

(72) Inventors: Suk Youn, Seoul (KR); Chan Ho Lee, Hwaseong-si (KR); Uk Rae Cho, Suwon-si (KR); Woo jin Jung, Seoul (KR); Kyu Won Choi, Suwon-si (KR)

(73) Assignee: Samsung Electronics Co., Ltd.

( * ) Notice: Subject to any disclaimer, the term of this patent is extended or adjusted under 35 U.S.C. 154(b) by 366 days.

(21) Appl. No.: 16/835,557

(22) Filed: Mar. 31, 2020

(65) Prior Publication Data
US 2021/0028109 A1 Jan. 28, 2021

(30) Foreign Application Priority Data

Jul. 23, 2019 (KR) .................. 10-2019-0088859
Nov. 7, 2019 (KR) .................. 10-2019-0141482

(51) Int. Cl.
| G11C 7/18 | (2006.01) |
| H01L 23/528 | (2006.01) |
| H01L 27/105 | (2006.01) |
| H01L 29/06 | (2006.01) |
| G11C 8/14 | (2006.01) |
| H01L 27/088 | (2006.01) |
| H01L 29/78 | (2006.01) |

(52) U.S. Cl.
CPC ............ *H01L 23/5286* (2013.01); *G11C 7/18* (2013.01); *G11C 8/14* (2013.01); *H01L 27/0886* (2013.01); *H01L 27/1052* (2013.01); *H01L 29/0673* (2013.01); *H01L 29/7851* (2013.01)

(58) Field of Classification Search
USPC ......................................................... 257/499
See application file for complete search history.

(56) References Cited

U.S. PATENT DOCUMENTS

| 6,900,999 | B1 | 5/2005 | Yen et al. |
| 7,042,747 | B1 | 5/2006 | Castagnetti et al. |
| 7,355,873 | B2 | 4/2008 | Nii et al. |
| 9,406,681 | B2 | 8/2016 | Liaw |
| 9,437,588 | B1* | 9/2016 | Zeng ................... H01L 27/0207 |
| 10,262,720 | B2 | 4/2019 | Nii |
| 2019/0043582 | A1 | 2/2019 | Yabuuchi |
| 2019/0198507 | A1 | 6/2019 | Nii et al. |

\* cited by examiner

*Primary Examiner* — Monica D Harrison
(74) *Attorney, Agent, or Firm* — Myers Bigel, P.A.

(57) ABSTRACT

A semiconductor device includes a substrate including a first cell region, a second cell region adjacent to the first cell region in a first direction, and a comparison region adjacent the first and second cell regions in a second direction, a bit line in a first metal level on the substrate and extending in the first direction, and a first ground rail in a second metal level different from the first metal level. The first ground rail comprises a first sub-ground rail extending in the second direction on the first cell region, a second sub-ground rail extending in the second direction on the second cell region, a third sub-ground rail connecting the first sub-ground rail to the second sub-ground rail on the first and second cell regions, and a fourth sub-ground rail that branches off from the third sub-ground rail and extends in the second direction.

20 Claims, 17 Drawing Sheets

SEMICONDUCTOR DEVICES

This application claims the benefit of Korean Patent Application No. 10-2019-0088859, filed in the Korean Intellectual Property Office on Jul. 23, 2019, and the benefit of Korean Patent Application No. 10-2019-0141482, filed in the Korean Intellectual Property Office on Nov. 7, 2019, the entire contents of each of which are incorporated herein by reference.

BACKGROUND

1. Technical Field

The present disclosure relates to semiconductor devices and, more specifically, semiconductor devices including ground rails.

2. Description of the Related Art

A content-addressable memory (CAM) cell may include a static random access memory (SRAM) portion responsible for storage and a CAM portion responsible for comparison to form one CAM cell. CAM cells include a NOR-type CAM and a NAND-type CAM.

Relatively many NOR-type CAMs are used because the NOR-type CAM has a speed greater than that of the NAND-type CAM. A 16T (16 transistors) NOR-type CAM may be referred to as a ternary CAM, also called a TCAM, and a 10T NOR-type CAM may be referred to as a binary CAM, also called a BCAM.

SUMMARY

Aspects of the present disclosure provide semiconductor devices having an improved degree of integration by forming ground rails in a mesh shape on an identical metal level.

According to an example embodiment of the present disclosure, there is provided a semiconductor device comprising a substrate including a first cell region, a second cell region that is adjacent the first cell region in a first direction, and a comparison region that is adjacent the first and second cell regions in a second direction different from the first direction, a bit line in a first metal level on the substrate, the bit line extending in the first direction, and a first ground rail in a second metal level different from the first metal level, wherein the first ground rail comprises a first sub-ground rail extending in the second direction on the first cell region, a second sub-ground rail extending in the second direction on the second cell region, a third sub-ground rail connecting the first sub-ground rail to the second sub-ground rail on the first and second cell regions, and a fourth sub-ground rail that branches off from the third sub-ground rail and extends in the second direction.

According to an example embodiment of the present disclosure, there is provided a semiconductor device comprising a substrate including a first cell region and a second cell region that is adjacent the first cell region in a first direction, a first nanowire and a second nanowire that extend in the first direction and are stacked on the substrate to be sequentially spaced apart from each other, a gate electrode extending in a second direction different from the first direction and surrounding each of the first and second nanowires, a bit line in a first metal level on the substrate, the bit line extending in the first direction, and a first ground rail in a second metal level that is on the first metal level, wherein the first ground rail comprises a first sub-ground rail extending in the second direction on the first cell region, a second sub-ground rail extending in the second direction on the second cell region, a third sub-ground rail that is on the first and second cell regions and connects the first sub-ground rail to the second sub-ground rail, and a fourth sub-ground rail that branches off from the third sub-ground rail and extends in the second direction.

According to an example embodiment of the present disclosure, there is provided a semiconductor device comprising a substrate comprising a first cell region, a second cell region that is adjacent the first cell region in a first direction, and a comparison region that is adjacent the first and second cell regions in a second direction that is different from the first direction, a first nanowire and a second nanowire that extend in the first direction and are stacked on the substrate to be sequentially spaced apart from each other, a gate electrode extending in the second direction and surrounding each of the first and second nanowires, a bit line in a first metal level on the substrate, the bit line extending in the first direction, and a first ground rail in a second metal level that is at a different vertical level from the first metal level, wherein the first ground rail comprises a first sub-ground rail extending in the second direction on the first cell region, a second sub-ground rail extending in the second direction on the second cell region, a third sub-ground rail extending in the first direction on the first and second cell regions and connecting the first sub-ground rail to the second sub-ground rail, and a fourth sub-ground rail that branches off from the third sub-ground rail and extends in the second direction.

The scope of the present disclosure is not limited to the above-described embodiments, and other unmentioned embodiments may be clearly understood by those skilled in the art from the following description.

BRIEF DESCRIPTION OF THE DRAWINGS

The above and other aspects and features of the present disclosure will become more apparent by describing example embodiments thereof in detail with reference to the attached drawings, in which.

DETAILED DESCRIPTION

Figure 1:
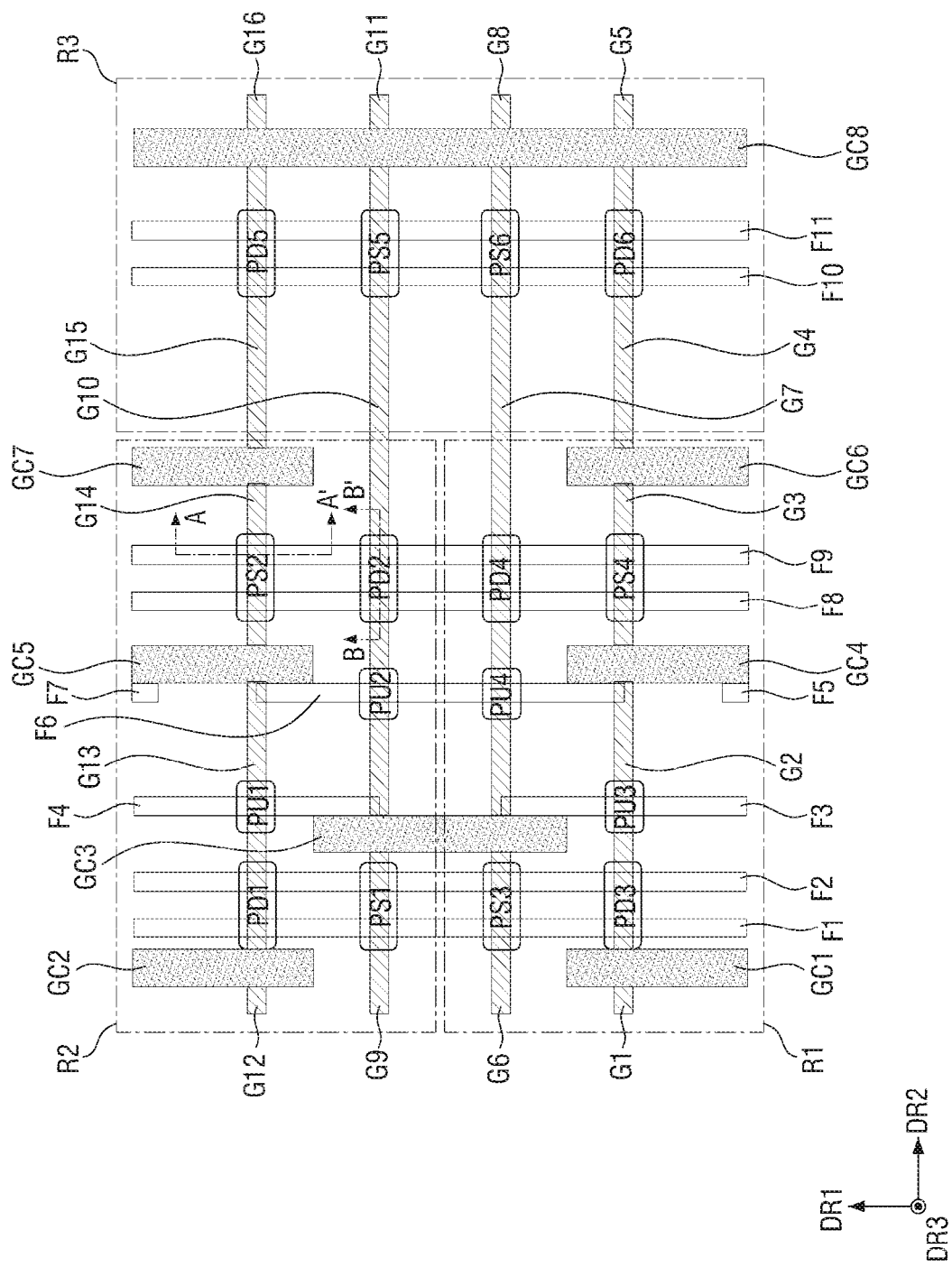
FIGS. 1 to 11 are views for describing a semiconductor device according to some example embodiments of the present disclosure.

In the drawings of a semiconductor device according to some example embodiments of the present disclosure, an example of a transistor (multi-bridge channel field-effect transistor (MBCFET™)) including nanowires and an example of a fin-shaped field-effect transistor (FinFET) including a channel region having a fin-shaped pattern are illustrated, but the present disclosure is not limited thereto. The semiconductor device according to some other example embodiments may also include a tunneling field-effect transistor (tunneling FET) or a three-dimensional (3D) transistor. In addition, a semiconductor device according to some other example embodiments may include a bipolar junction transistor, a laterally-diffused metal-oxide semiconductor (LDMOS) transistor, or the like.

Hereinafter, semiconductor devices according to some example embodiments of the present disclosure will be described with reference to FIGS. 1 to 11.

Figure 2:
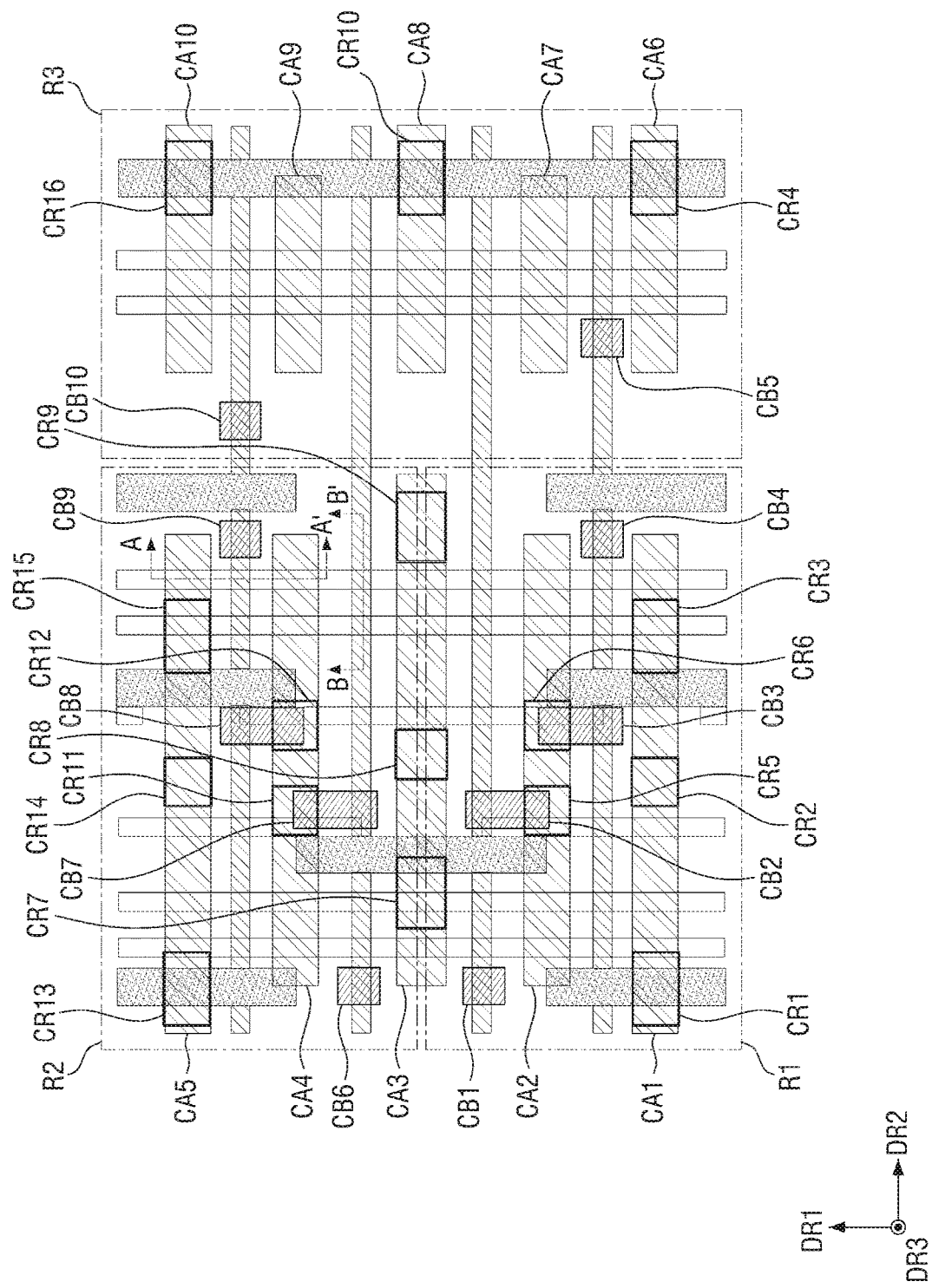
Figure 3:
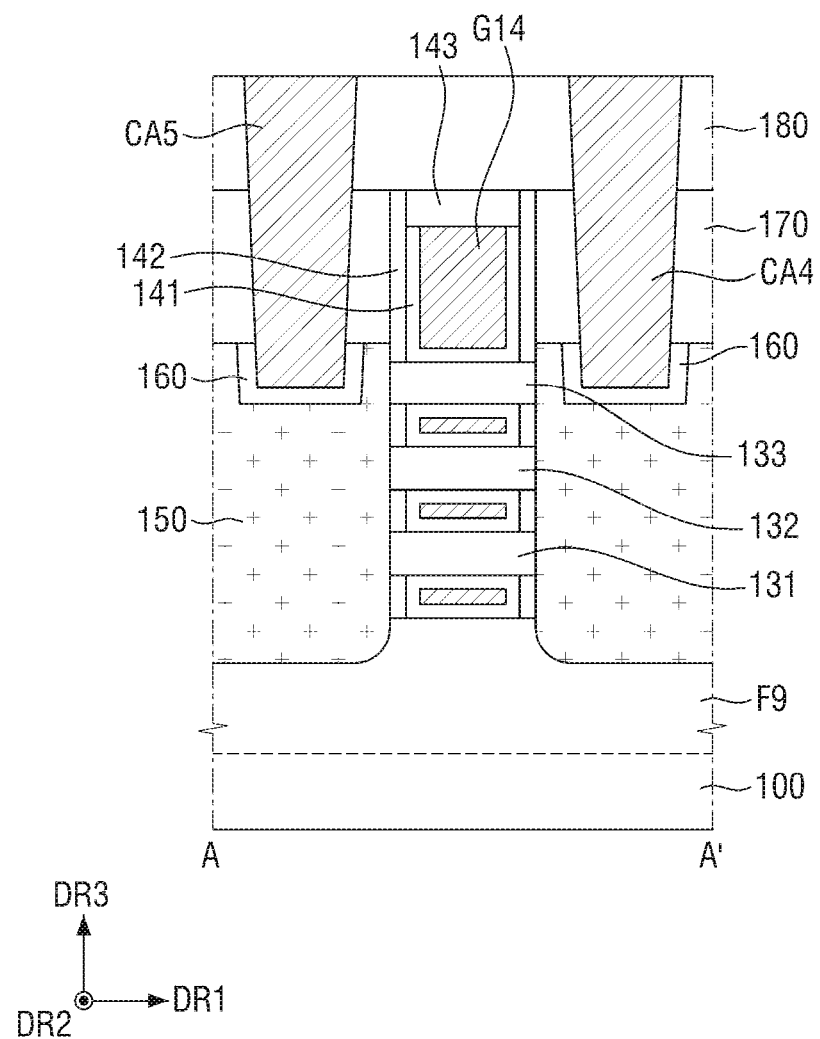
Figure 4:
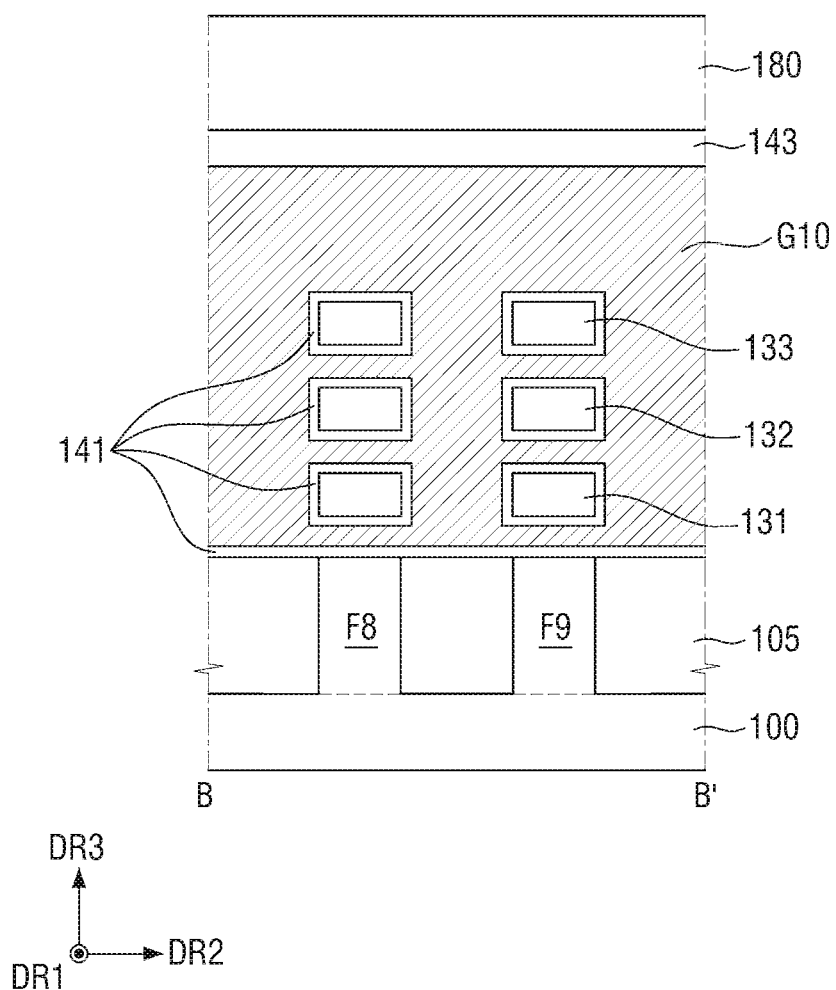
Figure 5:
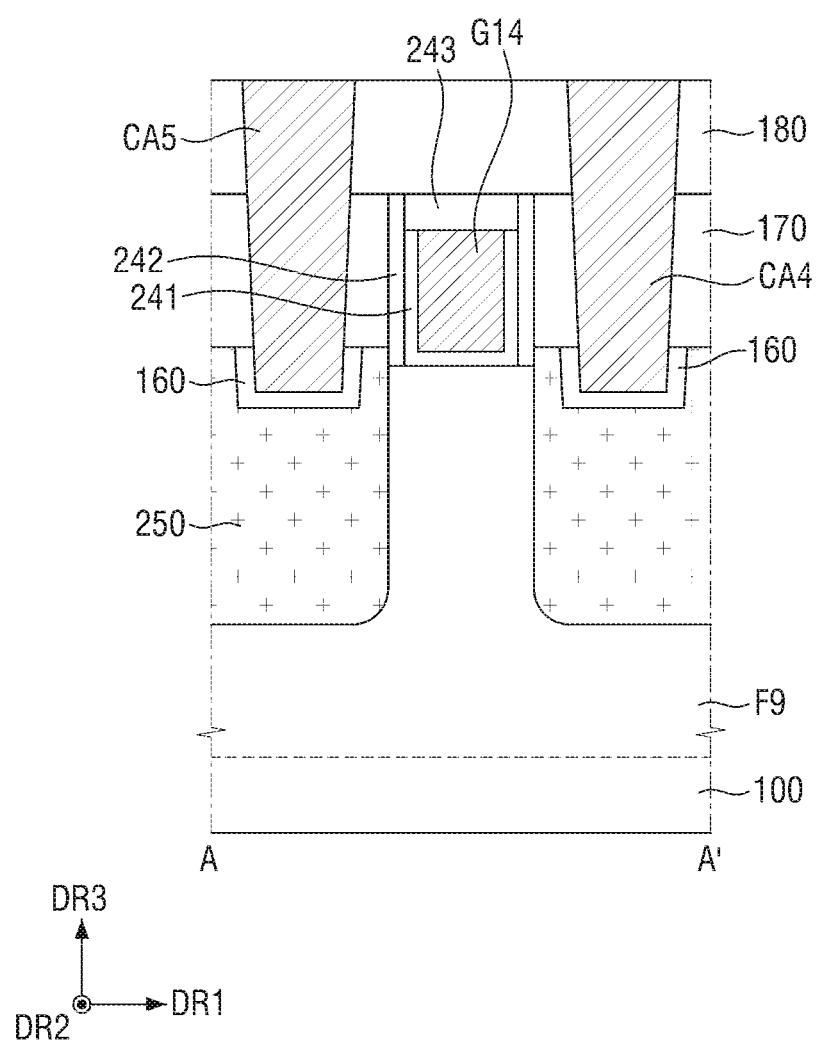
Figure 6:
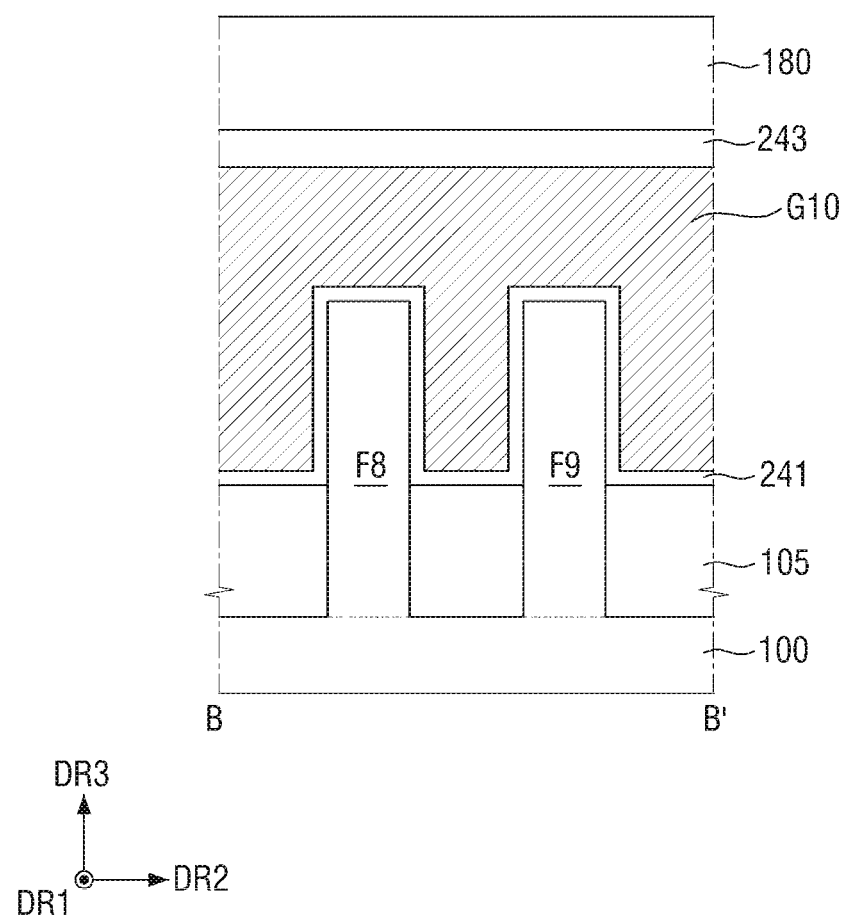
Figure 7:
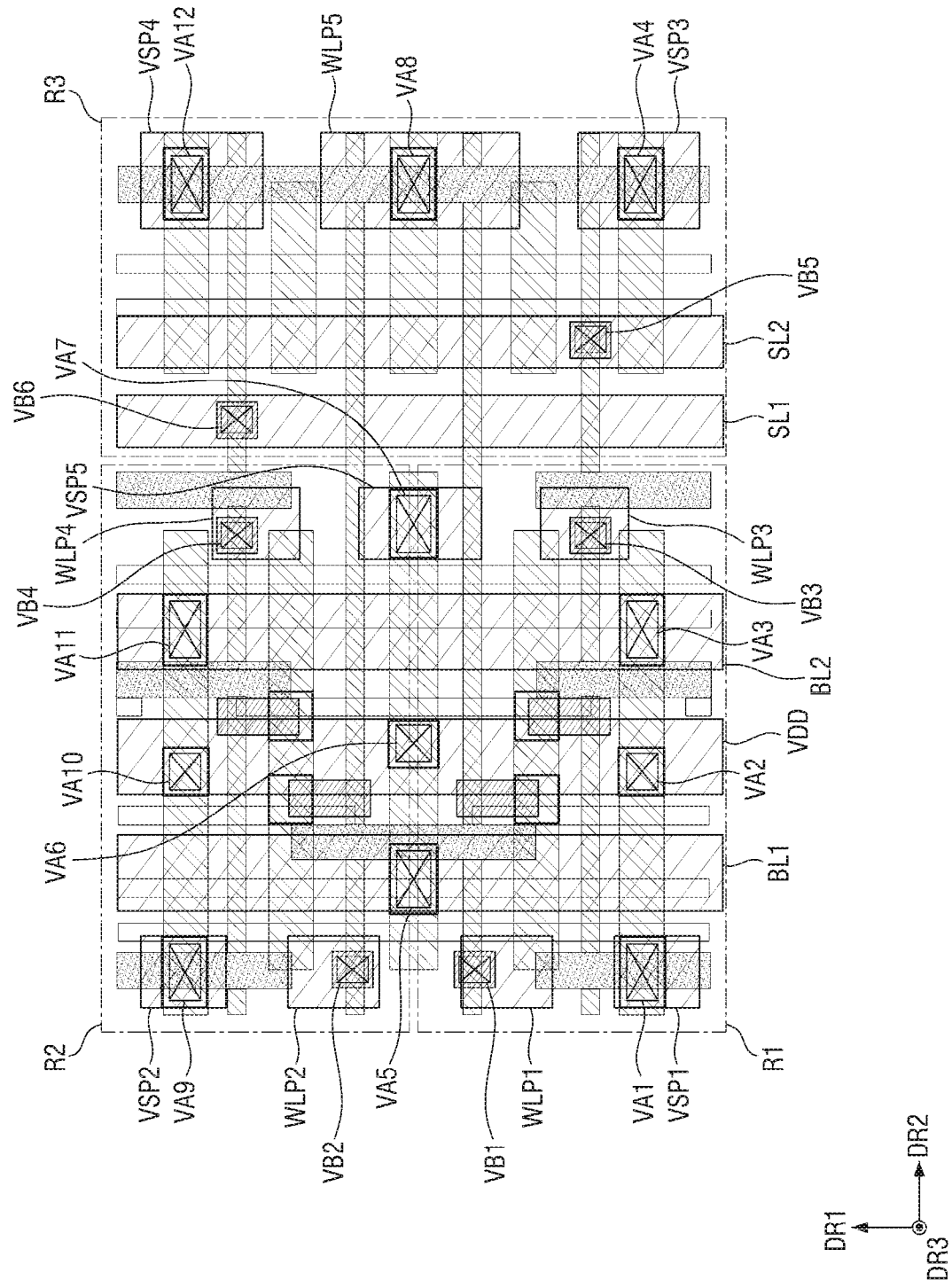
Figure 8:
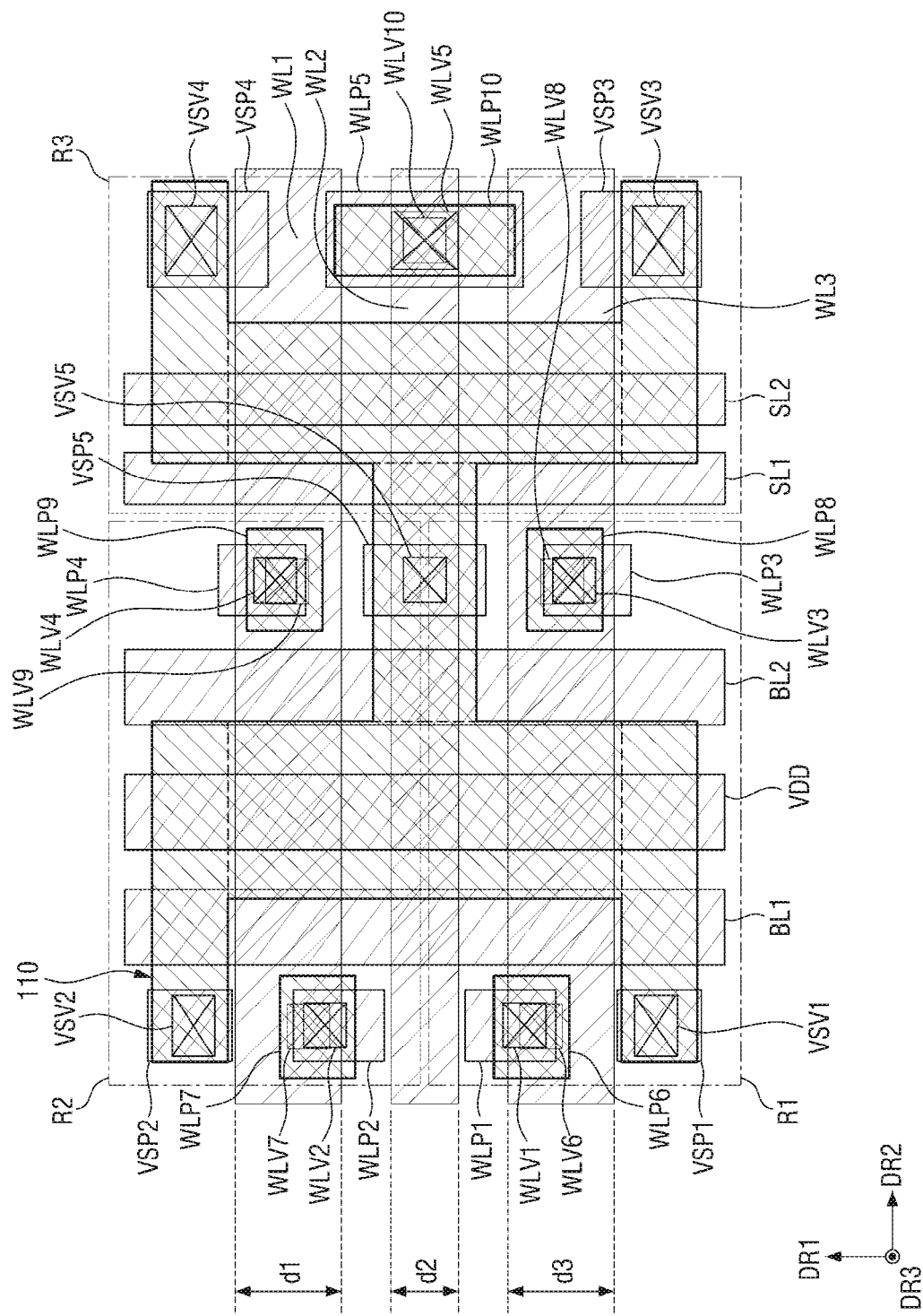
Figure 9:
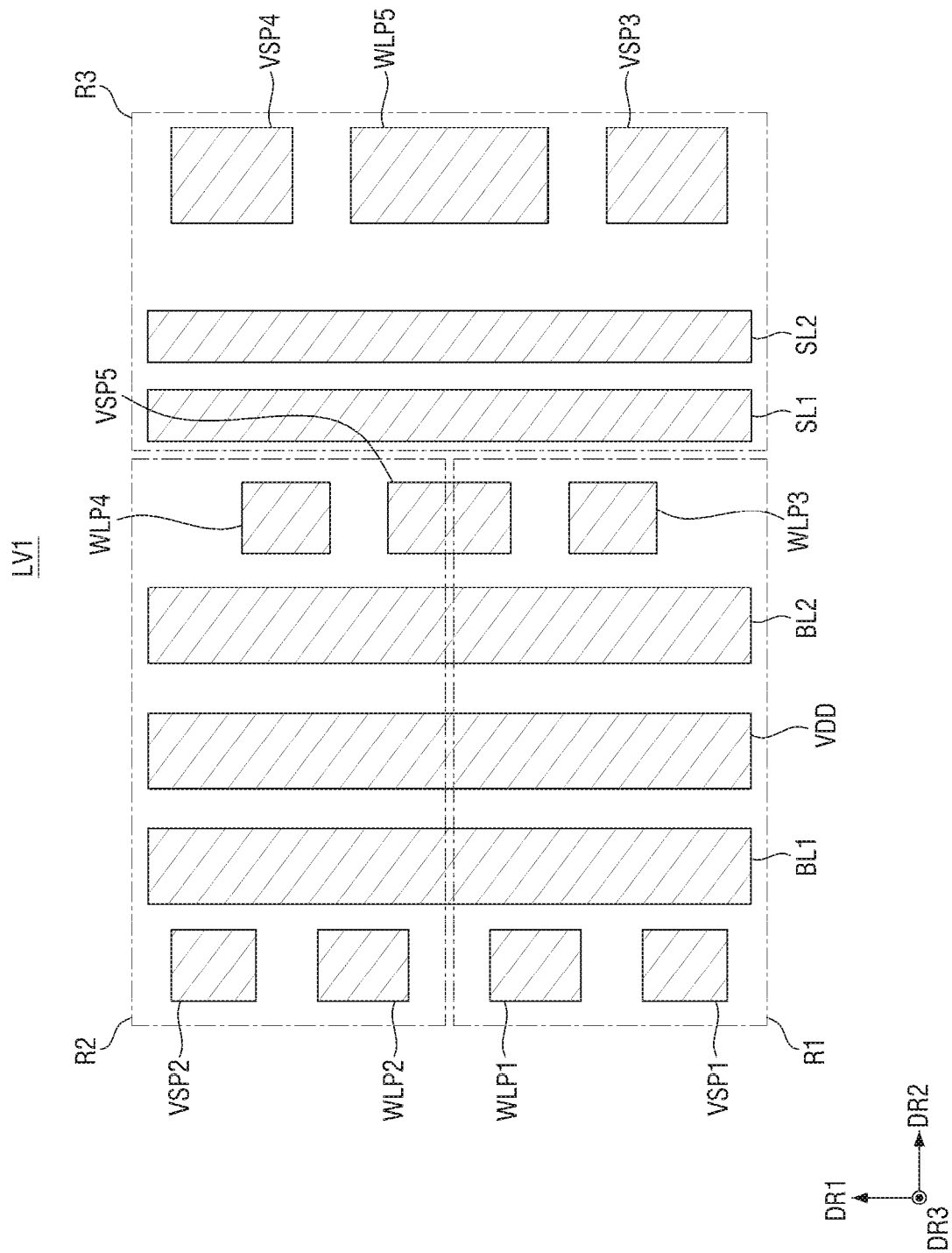
Figure 10:
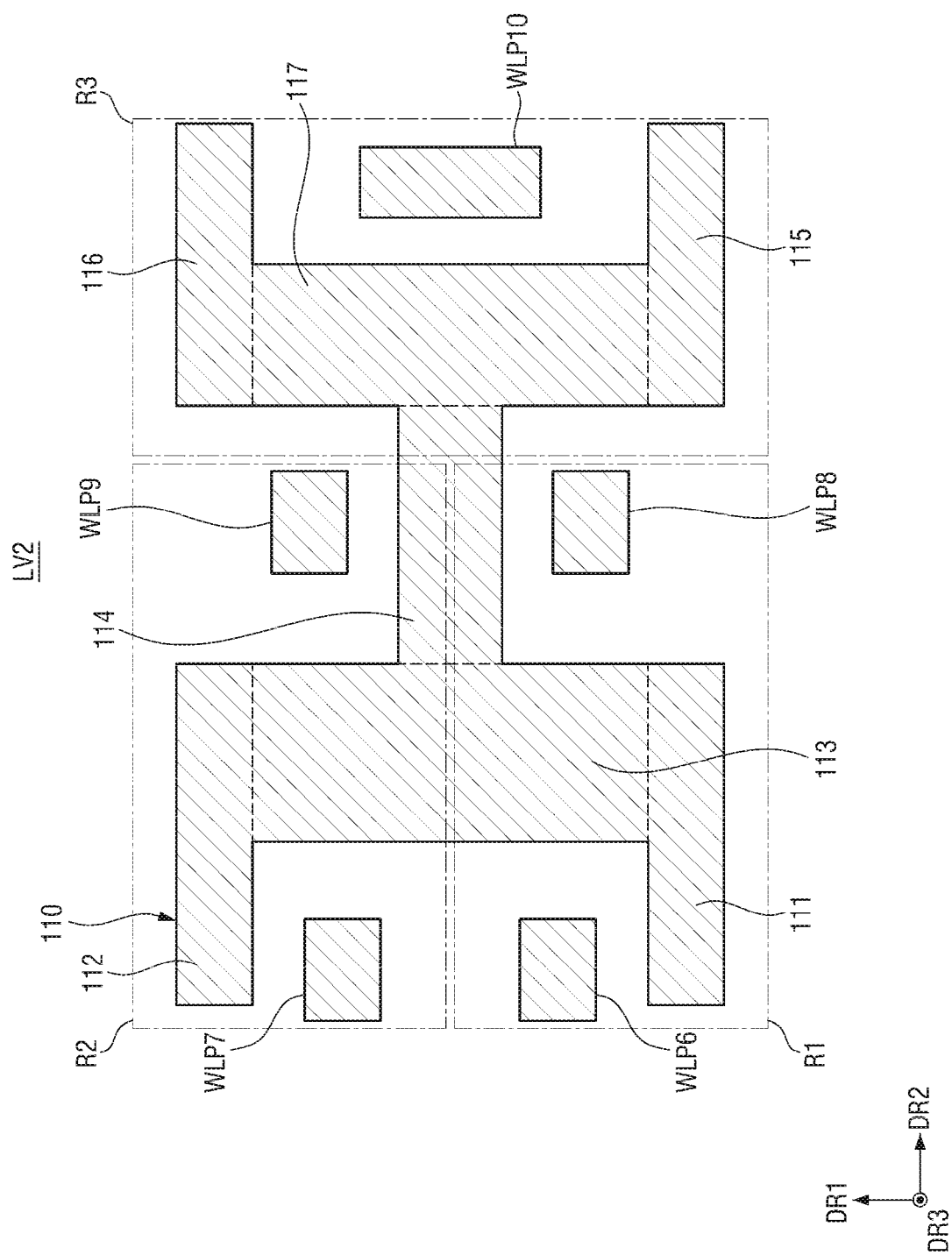
Figure 11:
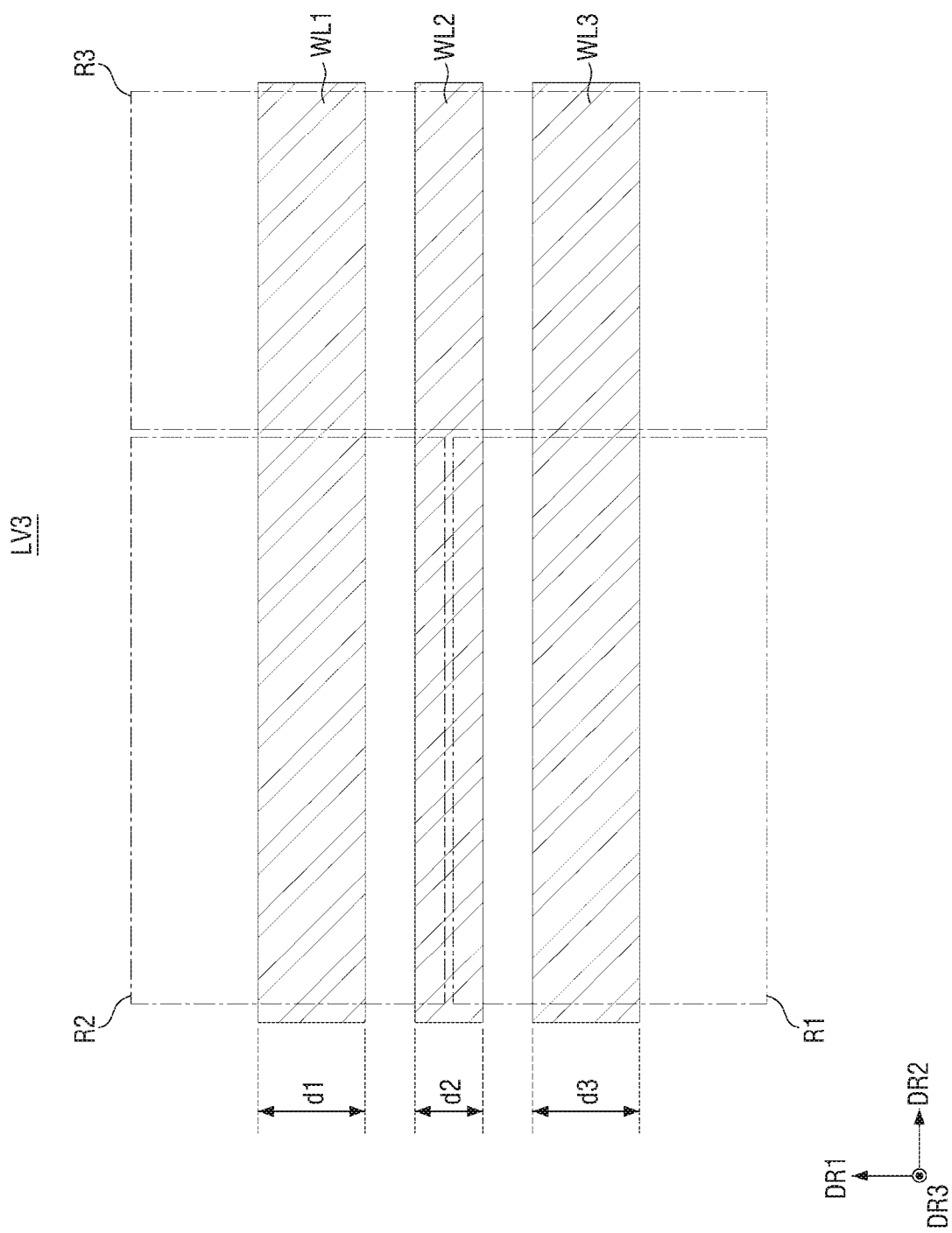

FIG. 1 is a view illustrating a front-end-of-line (FEOL) stage of the semiconductor device according to some example embodiments of the present disclosure. In some embodiments, the FEOL stage of the semiconductor device processing may include portions of the semiconductor device processing prior to the deposition of metal interconnect layers. FIG. 2 is a view illustrating a middle-of-line (MOL) stage of the semiconductor device according to some example embodiments of the present disclosure. In some embodiments, the MOL stage of the semiconductor device processing may include processing that connects, e.g., with contact structures, elements formed during the FEOL stage. FIGS. 3 and 5 are cross-sectional views taken along line A-A' of FIG. 2. FIGS. 4 and 6 are cross-sectional views taken along line B-B' of FIG. 2. In some embodiments, generating the interconnections between the elements of the semiconductor device may involve the formation of one or more stacked metal levels with respective ones of the metal levels at different vertical heights in the stack. FIG. 7 is a view illustrating a first metal level of the semiconductor device according to some example embodiments of the present disclosure. FIG. 8 is a view of first to third metal levels of the semiconductor device according to some example embodiments of the present disclosure. FIG. 9 is a view of the first metal level of the semiconductor device according to some example embodiments of the present disclosure. FIG. 10 is a view of the second metal level of the semiconductor device according to some example embodiments of the present disclosure. FIG. 11 is a view of the third metal level of the semiconductor device according to some example embodiments of the present disclosure.

Referring to FIGS. 1 to 11, the semiconductor device according to some example embodiments of the present disclosure may include first to sixteenth gate electrodes G1 to G16, first to eleventh fin-shaped patterns F1 to F11, first to tenth source/drain contacts CA1 to CA10, first to tenth gate contacts CB1 to CB10, first to eighth gate cuts GC1 to GC8, first to twelfth source/drain vias VA1 to VA12, first to sixth gate vias VB1 to VB6, first to fifth ground pads VSP1 to VSP5, first to tenth word line pads WLP1 to WLP10, first to fifth ground vias VSV1 to VSV5, first to tenth word line vias WLV1 to WLV10, a first bit line BL1, a second bit line BL2, a power rail VDD, a first search line SL1, a second search line SL2, first to third word lines WL1 to WL3, a substrate 100, a field insulating film 105, a first ground rail 110, first to seventh sub-ground rails 111 to 117, first to third nanowires 131 to 133, a gate insulating film 141, a gate spacer 142, a capping pattern 143, a source/drain region 150, a silicide layer 160, a first interlayer insulating film 170, and a second interlayer insulating film 180. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts.

The substrate 100 may include bulk silicon or a silicon-on-insulator (SOI). In some embodiments, the substrate 100 may be a silicon substrate or may include another material such as silicon germanium on insulator (SGOI), indium antimonide, a lead tellurium compound, indium arsenide, indium phosphide, gallium arsenide, or gallium antimonide. However, the present disclosure is not limited thereto.

The substrate 100 may include a first cell region R1, a second cell region R2, and a comparison region R3. The first cell region R1 and the second cell region R2 may be disposed adjacent to each other in a first direction DR1. The comparison region R3 may be disposed adjacent to each of the first cell region R1 and the second cell region R2 in a second direction DR2 different from the first direction DR1.

The first cell region R1 and the second cell region R2 may be storage regions. That is, a storage device may be formed in each of the first cell region R1 and the second cell region R2. In this case, the storage device may be a static random access memory (SRAM).

A comparator for comparing signals of the first cell region R1 and the second cell region R2 with each other may be formed in the comparison region R3. That is, in the semiconductor device according to some example embodiments of the present disclosure, a ternary content-addressable memory (TCAM) cell may be formed.

The description of the FEOL stage of the semiconductor device according to some example embodiments of the present disclosure will be given with reference to FIG. 1. Referring to FIG. 1, each of the first to eleventh fin-shaped patterns F1 to F11 may extend in the first direction DR1.

The first fin-shaped pattern F1 may extend in the first direction DR1 on the first and second cell regions R1 and R2. The second fin-shaped pattern F2 may extend in the first direction DR1 on the first and second cell regions R1 and R2 and may be spaced apart from the first fin-shaped pattern F1 in the second direction DR2. The third fin-shaped pattern F3 may extend in the first direction DR1 on the first cell region R1 and may be spaced apart from the second fin-shaped pattern F2 in the second direction DR2. The fourth fin-shaped pattern F4 may extend in the first direction DR1 on the second cell region R2, may be spaced apart from the third fin-shaped pattern F3 in the first direction DR1, and may be spaced apart from the second fin-shaped pattern F2 in the second direction DR2.

The fifth fin-shaped pattern F5 may extend in the first direction DR1 on the first cell region R1 and may be spaced apart from the third fin-shaped pattern F3 in the second direction DR2. The sixth fin-shaped pattern F6 may extend in the first direction DR1 on the first and second cell regions R1 and R2, may be spaced apart from the fifth fin-shaped pattern F5 in the first direction DR1, and may be spaced apart from the third and fourth fin-shaped patterns F3 and F4 in the second direction DR2. The seventh fin-shaped pattern F7 may extend in the first direction DR1 on the second cell region R2, may be spaced apart from the sixth fin-shaped pattern F6 in the first direction DR1, and may be spaced apart from the fourth fin-shaped pattern F4 in the second direction DR2.

The eighth fin-shaped pattern F8 may extend in the first direction DR1 on the first and second cell regions R1 and R2 and may be spaced apart from the fifth to seventh fin-shaped patterns F5, F6, and F7 in the second direction DR2. The ninth fin-shaped pattern F9 may extend in the first direction DR1 on the first and second cell regions R1 and R2 and may be spaced apart from the eighth fin-shaped pattern F8 in the second direction DR2. The tenth fin-shaped pattern F10 may extend in the first direction DR1 on the comparison region R3 and may be spaced apart from the ninth fin-shaped pattern F9 in the second direction DR2. The eleventh fin-shaped pattern F11 may extend in the first direction DR1 on the comparison region R3 and may be spaced apart from the tenth fin-shaped pattern F10 in the second direction DR2.

Each of the first to sixteenth gate electrodes G1 to G16 may extend in the second direction DR2.

The first gate electrode G1 may extend in the second direction DR2 on the first cell region R1. The second gate electrode G2 may extend in the second direction DR2 on the first cell region R1 and may be spaced apart from the first gate electrode G1 in the second direction DR2. The second gate electrode G2 may cross each of the first, second, third, and sixth fin-shaped patterns F1, F2, F3, and F6. The third gate electrode G3 may extend in the second direction DR2 on the first cell region R1 and may be spaced apart from the second gate electrode G2 in the second direction DR2. The third gate electrode G3 may cross each of the eighth and ninth fin-shaped patterns F8 and F9. The fourth gate electrode G4 may extend in the second direction DR2 on the comparison region R3 and may be spaced apart from the third gate electrode G3 in the second direction DR2. The fourth gate electrode G4 may cross each of the tenth and eleventh fin-shaped patterns F10 and F11. The fifth gate electrode G5 may extend in the second direction DR2 on the comparison region R3 and may be spaced apart from the fourth gate electrode G4 in the second direction DR2.

The sixth gate electrode G6 may extend in the second direction DR2 on the first cell region R1 and may be spaced apart from each of the first and second gate electrodes G1 and G2 in the first direction DR1. The sixth gate electrode G6 may cross each of the first and second fin-shaped patterns F1 and F2. The seventh gate electrode G7 may extend in the second direction DR2 on the first cell region R1 and the comparison region R3, may be spaced apart from the sixth gate electrode G6 in the second direction DR2, and may be spaced apart from each of the second to fourth gate electrodes G2, G3, and G4 in the first direction DR1. The seventh gate electrode G7 may cross each of the third, sixth, and eight to eleventh fin-shaped patterns F3, F6, and F8 to F11. The eighth gate electrode G8 may extend in the second direction DR2 on the comparison region R3, may be spaced apart from the seventh gate electrode G7 in the second direction DR2, and may be spaced apart from the fifth gate electrode G5 in the first direction DR1.

The ninth gate electrode G9 may extend in the second direction DR2 on the second cell region R2 and may be spaced apart from the sixth gate electrode G6 in the first direction DR1. The ninth gate electrode G9 may cross each of the first and second fin-shaped patterns F1 and F2. The tenth gate electrode G10 may extend in the second direction DR2 on the second cell region R2 and the comparison region R3, may be spaced apart from the ninth gate electrode G9 in the second direction DR2, and may be spaced apart from the seventh gate electrode G7 in the first direction DR1. The tenth gate electrode G10 may cross each of the fourth, sixth, and eight to eleventh fin-shaped patterns F4, F6, and F8 to F11. The eleventh gate electrode G11 may extend in the second direction DR2 on the comparison region R3, may be spaced apart from the tenth gate electrode G10 in the second direction DR2, and may be spaced apart from the eighth gate electrode G8 in the first direction DR1.

The twelfth gate electrode G12 may extend in the second direction DR2 on the second cell region R2 and may be spaced apart from the ninth gate electrode G9 in the first direction DR1. The thirteenth gate electrode G13 may extend in the second direction DR2 on the second cell region R2, may be spaced apart from the ninth and tenth gate electrodes G9 and G10 each of in the first direction DR1, and may be spaced apart from the twelfth gate electrode G12 in the second direction DR2. The thirteenth gate electrode G13 may cross each of the first, second, fourth, and sixth fin-shaped patterns F1, F2, F4, and F6. The fourteenth gate electrode G14 may extend in the second direction DR2 on the second cell region R2, may be spaced apart from the tenth gate electrode G10 in the first direction DR1, and may be spaced apart from the thirteenth gate electrode G13 in the second direction DR2. The fourteenth gate electrode G14 may cross each of the eighth and ninth fin-shaped patterns F8 and F9. The fifteenth gate electrode G15 may extend in the second direction DR2 on the comparison region R3, may be spaced apart from the tenth gate electrode G10 in the first direction DR1, and may be spaced apart from the fourteenth gate electrode G14 in the second direction DR2. The fifteenth gate electrode G15 may cross each of the tenth and eleventh fin-shaped patterns F10 and F11. The sixteenth gate electrode G16 may extend in the second direction DR2 on the comparison region R3, may be spaced apart from the eleventh gate electrode G11 in the first direction DR1, and may be spaced apart from the fifteenth gate electrode G15 in the second direction DR2.

The first gate cut GC1 may extend in the first direction DR1 on the first cell region R1 and may be disposed between the first gate electrode G1 and the second gate electrode G2. The second gate cut GC2 may extend in the first direction DR1 on the second cell region R2 and may be disposed between the twelfth gate electrode G12 and the thirteenth gate electrode G13. The third gate cut GC3 may extend in the first direction DR1 on the first and second cell regions R1 and R2 and may be disposed between the sixth gate electrode G6 and the seventh gate electrode G7 and between the ninth gate electrode G9 and the tenth gate electrode G10.

The fourth gate cut GC4 may extend in the first direction DR1 on the first cell region R1 and may be disposed between the second gate electrode G2 and the third gate electrode G3. The fifth gate cut GC5 may extend in the first direction DR1 on the second cell region R2 and may be disposed between the thirteenth gate electrode G13 and the fourteenth gate electrode G14. The sixth gate cut GC6 may extend in the first direction DR1 on the first cell region R1 and may be disposed between the third gate electrode G3 and the fourth gate electrode G4. The seventh gate cut GC7 may extend in the first direction DR1 on the second cell region R2 and may be disposed between the fourteenth gate electrode G14 and the fifteenth gate electrode G15. The eighth gate cut GC8 may extend in the first direction DR1 on the comparison region R3. The eighth gate cut GC8 may be disposed between the fourth gate electrode G4 and the fifth gate electrode G5, between the seventh gate electrode G7 and the eighth gate electrode G8, between the tenth gate electrode G10 and the eleventh gate electrode G11, and between the fifteenth gate electrode G15 and the sixteenth gate electrode G16.

The first and second fin-shaped patterns F1 and F2 and the thirteenth gate electrode G13 may form a first pull-down transistor PD1. The fourth fin-shaped pattern F4 and the thirteenth gate electrode G13 may form a first pull-up transistor PU1. The first and second fin-shaped patterns F1 and F2 and the ninth gate electrode G9 may form a first pass transistor PS1. The eighth and ninth fin-shaped patterns F8 and F9 and the tenth gate electrode G10 may form a second pull-down transistor PD2. The sixth fin-shaped pattern F6 and the tenth gate electrode G10 may form a second pull-up transistor PU2. The eighth and ninth fin-shaped patterns F8 and F9 and the fourteenth gate electrode G14 may form a second pass transistor PS2.

The first and second fin-shaped patterns F1 and F2 and the second gate electrode G2 may form a third pull-down transistor PD3. The third fin-shaped pattern F3 and the second gate electrode G2 may form a third pull-up transistor PU3. The first and second fin-shaped patterns F1 and F2 and the sixth gate electrode G6 may form a third pass transistor PS3. The eighth and ninth fin-shaped patterns F8 and F9 and the seventh gate electrode G7 may form a fourth pull-down transistor PD4. The sixth fin-shaped pattern F6 and the seventh gate electrode G7 may form a fourth pull-up transistor PU4. The eighth and ninth fin-shaped patterns F8 and F9 and the third gate electrode G3 may form a fourth pass transistor PS4.

The tenth and eleventh fin-shaped patterns F10 and F11 and the fifteenth gate electrode G15 may form a fifth pull-down transistor PD5. The tenth and eleventh fin-shaped patterns F10 and F11 and the tenth gate electrode G10 may form a fifth pass transistor PSS. The tenth and eleventh fin-shaped patterns F10 and F11 and the fourth gate electrode G4 may form a sixth pull-down transistor PD6. The tenth and eleventh fin-shaped patterns F10 and F11 and the seventh gate electrode G7 may form a sixth pass transistor PS6.

The description of the MOL stage of the semiconductor device according to some example embodiments of the present disclosure will be given with reference to FIG. 2.

Referring to FIG. 2, the first source/drain contact CA1 may extend in the second direction DR2 on the first cell region R1. The first source/drain contact CA1 may cross each of the first and fourth gate cuts GC1 and GC4 and each of the first, second, third, eighth, and ninth fin-shaped patterns F1, F2, F3, F8, and F9. The first source/drain contact CA1 may include first to third protrusions CR1, CR2, and CR3 protruding in a third direction DR3. The third direction DR3 may be different from the first direction DR1 and the second direction DR2.

The second source/drain contact CA2 may extend in the second direction DR2 on the first cell region R1 and may be spaced apart from the first source/drain contact CA1 in the first direction DR1. The second source/drain contact CA2 may be on and/or cross each of the first, third, and fourth gate cuts GC1, GC3, and GC4 and each of the first, second, third, sixth, eighth, and ninth fin-shaped patterns F1, F2, F3, F6, F8, and F9. The second source/drain contact CA2 may include fifth and sixth protrusions CR5 and CR6 protruding in the third direction DR3.

The third source/drain contact CA3 may extend in the second direction DR2 on the first and second cell regions R1 and R2 and may be spaced apart from the second source/drain contact CA2 in the first direction DR1. The third source/drain contact CA3 may cross the third gate cut GC3 and each of the first, second, sixth, eighth, and ninth fin-shaped patterns F1, F2, F6, F8, and F9. The third source/drain contact CA3 may include seventh to ninth protrusions CR7, CR8, and CR9 protruding in the third direction DR3.

The fourth source/drain contact CA4 may extend in the second direction DR2 on the second cell region R2 and may be spaced apart from the third source/drain contact CA3 in the first direction DR1. The fourth source/drain contact CA4 may be on and/or cross each of the second, third, and fifth gate cuts GC2, GC3, and GC5 and each of the first, second, fourth, sixth, eighth, and ninth fin-shaped patterns F1, F2, F4, F6, F8, and F9. The fourth source/drain contact CA4 may include eleventh and twelfth protrusions CR11 and CR12 protruding in the third direction DR3.

The fifth source/drain contact CA5 may extend in the second direction DR2 on the second cell region R2 and may be spaced apart from the fourth source/drain contact CA4 in the first direction DR1. The fifth source/drain contact CA5 may cross each of the second and fifth gate cuts GC2 and GC5 and each of the first, second, fourth, eighth, and ninth fin-shaped patterns F1, F2, F4, F8, and F9. The fifth source/drain contact CA5 may include thirteenth to fifteenth protrusions CR13, CR14, and CR15 protruding in the third direction DR3.

The sixth source/drain contact CA6 may extend in the second direction DR2 on the comparison region R3 and may be spaced apart from the first source/drain contact CA1 in the second direction DR2. The sixth source/drain contact CA6 may include a fourth protrusion CR4 protruding in the third direction DR3.

The seventh source/drain contact CA7 may extend in the second direction DR2 on the comparison region R3, may be spaced apart from the sixth source/drain contact CA6 in the first direction DR1, and may be spaced apart from the second source/drain contact CA2 in the second direction DR2.

The eighth source/drain contact CA8 may extend in the second direction DR2 on the comparison region R3, may be spaced apart from the seventh source/drain contact CA7 in the first direction DR1, and may be spaced apart from the third source/drain contact CA3 in the second direction DR2. The eighth source/drain contact CA8 may include a tenth protrusion CR10 protruding in the third direction DR3.

The ninth source/drain contact CA9 may extend in the second direction DR2 on the comparison region R3, may be spaced apart from the eighth source/drain contact CA8 in the first direction DR1, and may be spaced apart from the fourth source/drain contact CA4 in the second direction DR2.

The tenth source/drain contact CA10 may extend in the second direction DR2 on the comparison region R3, may be spaced apart from the ninth source/drain contact CA9 in the first direction DR1, and may be spaced apart from the fifth source/drain contact CA5 in the second direction DR2. The tenth source/drain contact CA10 may include a sixteenth protrusion CR16 protruding in the third direction DR3.

Each of the sixth to tenth source/drain contacts CA6 to CA10 may be on and/or cross the eighth gate cut GC8 and each of the tenth and eleventh fin-shaped patterns F10 and F11.

The first gate contact CB1 may be disposed on the sixth gate electrode G6. The second gate contact CB2 may be disposed on the seventh gate electrode G7 and may be in contact with the fifth protrusion CR5 formed on the second source/drain contact CA2. The third gate contact CB3 may be disposed on the second gate electrode G2 and may be in contact with the sixth protrusion CR6 formed on the second source/drain contact CA2. The fourth gate contact CB4 may be disposed on the third gate electrode G3. The fifth gate contact CB5 may be disposed on the fourth gate electrode G4.

The sixth gate contact CB6 may be disposed on the ninth gate electrode G9. The seventh gate contact CB7 may be disposed on the tenth gate electrode G10 and may be in contact with the eleventh protrusion CR11 formed on the fourth source/drain contact CA4. The eighth gate contact CB8 may be disposed on the thirteenth gate electrode G13 and may be in contact with the twelfth protrusion CR12 formed on the fourth source/drain contact CA4. The ninth gate contact CB9 may be disposed on the fourteenth gate electrode G14. The tenth gate contact CB10 may be disposed on the fifteenth gate electrode G15.

An example of a cross-sectional structure of the semiconductor device taken along lines A-A' and B-B' of FIGS. 1 and 2 will be described with reference to FIGS. 3 and 4.

The semiconductor device according to some example embodiments of the present disclosure may have a transistor structure (e.g., an MBCFET™ structure) including a plurality of nanowires. The semiconductor device according to some example embodiments of the present disclosure may include a field insulating film 105, first to third nanowires 131, 132, and 133, a gate insulating film 141, a gate spacer 142, a capping pattern 143, a source/drain region 150, a silicide layer 160, a first interlayer insulating film 170, and a second interlayer insulating film 180.

Each of eighth and ninth fin-shaped patterns F8 and F9 may protrude from a substrate 100. Sidewalls of each of the eighth and ninth fin-shaped patterns F8 and F9 may be in contact with the field insulating film 105. Each of the eighth and ninth fin-shaped patterns F8 and F9 may be formed by etching a portion of the substrate 100 and/or may include an epitaxial layer grown from the substrate 100.

In FIGS. 3 and 4, an example in which the three nanowires 131, 132, and 133 are sequentially disposed on the substrate 100 is illustrated, but the present disclosure is not limited thereto. That is, in some other example embodiments, the number of nanowires disposed on the substrate 100 may vary.

The first to third nanowires 131, 132, and 133 may be sequentially disposed in the third direction DR3 on the substrate 100 to be spaced apart from each other. Each of the first to third nanowires 131, 132, and 133 may extend in the first direction DR1.

Each of the tenth and fourteenth gate electrodes G10 and G14 may extend in the second direction DR2 on the substrate 100. Each of the tenth and fourteenth gate electrodes G10 and G14 may surround the first to third nanowires 131, 132, and 133. It will be understood that "an element A surrounds an element B" (or similar language) as used herein means that the element A is at least partially around the element B but does not necessarily mean that the element A completely encloses the element B.

The gate spacer 142 may be disposed on both sidewalls of each of the tenth and fourteenth gate electrodes G10 and G14. The gate spacer 142 may extend in the second direction DR2 along the both sidewalls of each of the tenth and fourteenth gate electrodes G10 and G14.

In FIG. 3, the gate spacer 142 is illustrated as being formed as a single film, but the present disclosure is not limited thereto. That is, in some other example embodiments, the gate spacer 142 may be formed as multiple films.

The gate insulating film 141 may be disposed between each of the tenth and fourteenth gate electrodes G10 and G14 and the gate spacer 142, between each of the tenth and fourteenth gate electrodes G10 and G14 and the third nanowire 133, between each of the tenth and fourteenth gate electrodes G10 and G14 and the second nanowire 132, between each of the tenth and fourteenth gate electrodes G10 and G14 and the first nanowire 131, and between each of the tenth and fourteenth gate electrodes G10 and G14 and the ninth fin-shaped pattern F9.

The capping pattern 143 may be disposed on each of the tenth and fourteenth gate electrodes G10 and G14. In FIG. 3, the gate insulating film 141 is illustrated as not being disposed between the gate spacer 142 and the capping pattern 143, but the present disclosure is not limited thereto. That is, in some other example embodiments, the gate insulating film 141 may be disposed between the gate spacer 142 and the capping pattern 143.

The source/drain region 150 may be disposed on at least one side of the fourteenth gate electrode G14. The source/drain region 150 may be disposed on at least one side of each of the first to third nanowires 131, 132, and 133. The source/drain region 150 may be in contact with each of the first to third nanowires 131, 132, and 133.

The first interlayer insulating film 170 may be disposed on the source/drain region 150 and the field insulating film 105. The first interlayer insulating film 170 may be disposed to be on and/or surround sidewalls of the gate spacer 142. An upper surface of the first interlayer insulating film 170 may be coplanar with an upper surface of the capping pattern 143. The second interlayer insulating film 180 may be disposed on the first interlayer insulating film 170. The second interlayer insulating film 180 may be disposed to be on, and in some embodiments cover, an upper surface of the gate spacer 142 and the upper surface of the capping pattern 143.

The fourth source/drain contact CA4 and the fifth source/drain contact CA5 may be disposed in the second interlayer insulating film 180 and the first interlayer insulating film 170. The fourth source/drain contact CA4 may extend into the source/drain region 150 disposed on one side of the fourteenth gate electrode G14. The fifth source/drain contact CA5 may extend into the source/drain region 150 disposed on the other side of the fourteenth gate electrode G14.

Each of an upper surface of the fourth source/drain contact CA4 and an upper surface of the fifth source/drain contact CA5 may be coplanar with an upper surface of the second interlayer insulating film 180, however the present disclosure is not limited thereto.

The silicide layer 160 may be disposed between the fourth source/drain contact CA4 and the source/drain region 150 and between the fifth source/drain contact CA5 and the source/drain region 150.

An example of a cross-sectional structure of the semiconductor device taken along lines A-A' and B-B' of FIGS. 1 and 2 will be described with reference to FIGS. 5 and 6. A difference between the semiconductor device illustrated in FIGS. 5 and 6 and the semiconductor device illustrated in FIGS. 3 and 4 will mainly be described.

Referring to FIGS. 5 and 6, the semiconductor device according to some other example embodiments of the present disclosure may have a fin-shaped transistor (FinFET) structure including a channel region having a fin-shaped pattern. The semiconductor device according to some other example embodiments of the present disclosure may include a field insulating film 105, a gate insulating film 241, a gate spacer 242, a capping pattern 243, a source/drain region 250, a silicide layer 160, a first interlayer insulating film 170, and a second interlayer insulating film 180.

Each of tenth and fourteenth gate electrodes G10 and G14 may extend in a second direction DR2 on the substrate 100. Each of the tenth and fourteenth gate electrodes G10 and G14 may extend in the second direction DR2 on each of eighth and ninth fin-shaped patterns F8 and F9.

The gate spacer 242 may be disposed on both sidewalls of each of the tenth and fourteenth gate electrodes G10 and G14. The gate spacer 242 may extend in the second direction DR2 along the both sidewalls of each of the tenth and fourteenth gate electrodes G10 and G14.

The gate insulating film 241 may be disposed between each of the tenth and fourteenth gate electrodes G10 and G14 and the gate spacer 242 and between each of the tenth and fourteenth gate electrodes G10 and G14 and each of the eighth and ninth fin-shaped patterns F8 and F9.

The capping pattern 243 may be disposed on each of the tenth and fourteenth gate electrodes G10 and G14. The source/drain region 250 may be disposed on at least one side of the fourteenth gate electrode G14.

Referring to FIGS. 2, 7, and 9, the first to fifth ground pads VSP1 to VSP5, the first to fifth word line pads WLP1 to WLP5, the first bit line BL1, the power rail VDD, the second bit line BL2, the first search line SL1, and the second search line SL2 may be disposed in a first metal level LV1. The first metal level LV1 may be disposed on the MOL stage illustrated in FIG. 2.

The first ground pad VSP1 may be disposed on the first cell region R1. The first ground pad VSP1 may be connected to the first protrusion CR1 of the first source/drain contact CA1 through the first source/drain via VA1. The second ground pad VSP2 may be disposed on the second cell region R2. The second ground pad VSP2 may be connected to the thirteenth protrusion CR13 of the fifth source/drain contact CA5 through the ninth source/drain via VA9. The third ground pad VSP3 may be disposed on the comparison region R3. The third ground pad VSP3 may be connected to the fourth protrusion CR4 of the sixth source/drain contact CA6 through the fourth source/drain via VA4. The fourth ground pad VSP4 may be disposed on the comparison region R3. The fourth ground pad VSP4 may be connected to the sixteenth protrusion CR16 of the tenth source/drain contact CA10 through the twelfth source/drain via VA12. The fifth ground pad VSPS may be disposed on the first and second cell regions R1 and R2. The fifth ground pad VSPS may be connected to the ninth protrusion CR9 of the third source/drain contact CA3 through the seventh source/drain via VA7.

The first word line pad WLP1 may be disposed on the first cell region R1. The first word line pad WLP1 may be connected to the first gate contact CB1 through the first gate via VB1. The second word line pad WLP2 may be disposed on the second cell region R2. The second word line pad WLP2 may be connected to the sixth gate contact CB6 through the second gate via VB2. The third word line pad WLP3 may be disposed on the first cell region R1. The third word line pad WLP3 may be connected to the fourth gate contact CB4 through the third gate via VB3. The fourth word line pad WLP4 may be disposed on the second cell region R2. The fourth word line pad WLP4 may be connected to the ninth gate contact CB9 through the fourth gate via VB4. The fifth word line pad WLP5 may be disposed on the comparison region R3. The fifth word line pad WLP5 may be connected to the tenth protrusion CR10 of the eighth source/drain contact CA8 through the eighth source/drain via VA8.

The first bit line BL1 may extend in the first direction DR1 on the first and second cell regions R1 and R2. The first bit line BL1 may be connected to the seventh protrusion CR7 of the third source/drain contact CA3 through the fifth source/drain via VAS. The second bit line BL2 may extend in the first direction DR1 on the first and second cell regions R1 and R2 and may be spaced apart from the first bit line BL1 in the second direction DR2. The second bit line BL2 may be connected to the third protrusion CR3 of the first source/drain contact CA1 through the third source/drain via VA3. The second bit line BL2 may be connected to the fifteenth protrusion CR15 of the fifth source/drain contact CA5 through the eleventh source/drain via VA11.

The power rail VDD may extend in the first direction DR1 on the first and second cell regions R1 and R2 and may be disposed between the first bit line BL1 and the second bit line BL2. The power rail VDD may be connected to the second protrusion CR2 of the first source/drain contact CA1 through the second source/drain via VA2. The power rail VDD may be connected to the eighth protrusion CR8 of the third source/drain contact CA3 through the sixth source/drain via VA6. The power rail VDD may be connected to the fourteenth protrusion CR14 of the fifth source/drain contact CA5 through the tenth source/drain via VA10.

The first search line SL1 may extend in the first direction DR1 on the comparison region R3. The first search line SL1 may be connected to the tenth gate contact CB10 through the sixth gate via VB6. The second search line SL2 may extend in the first direction DR1 on the comparison region R3 and may be spaced apart from the first search line SL1 in the second direction DR2. The second search line SL2 may be connected to the fifth gate contact CB5 through the fifth gate via VB5.

Referring to FIGS. 8 and 10, the sixth to tenth word line pads WLP6 to WLP10 and the first ground rail 110 may be disposed in a second metal level LV2. The second metal level LV2 may be located on the first metal level LV1 illustrated in FIG. 9.

The sixth word line pad WLP6 may be disposed on the first cell region R1. The sixth word line pad WLP6 may be connected to the first word line pad WLP1 through the first word line via WLV1. The seventh word line pad WLP7 may be disposed on the second cell region R2. The seventh word line pad WLP7 may be connected to the second word line pad WLP2 through the second word line via WLV2.

The eighth word line pad WLP8 may be disposed on the first cell region R1. The eighth word line pad WLP8 may be connected to the third word line pad WLP3 through the third word line via WLV3. The ninth word line pad WLP9 may be disposed on the second cell region R2. The ninth word line pad WLP9 may be connected to the fourth word line pad WLP4 through the fourth word line via WLV4. The tenth word line pad WLP10 may be disposed on the comparison region R3. The tenth word line pad WLP10 may be connected to the fifth word line pad WLP5 through the fifth word line via WLV5.

The first ground rail 110 may include first to seventh sub-ground rails 111 to 117. The first ground rail 110 may have a mesh shape.

The first sub-ground rail 111 may extend in the second direction DR2 on the first cell region R1. The first sub-ground rail 111 may cross the first bit line BL1 and the power rail VDD. However, the present disclosure is not limited thereto. The first sub-ground rail 111 may be connected to the first ground pad VSP1 through the first ground via VSV1.

The second sub-ground rail 112 may extend in the second direction DR2 on the second cell region R2. The second sub-ground rail 112 may be spaced apart from the first sub-ground rail 111 in the first direction DR1. The second sub-ground rail 112 may cross the first bit line BL1 and the power rail VDD. However, the present disclosure is not limited thereto. The second sub-ground rail 112 may be connected to the second ground pad VSP2 through the second ground via VSV2.

The third sub-ground rail 113 may extend in the first direction DR1 over the first and second cell regions R1 and R2. The third sub-ground rail 113 may connect the first sub-ground rail 111 to the second sub-ground rail 112. The third sub-ground rail 113 may overlap the power rail VDD in the third direction DR3. However, the present disclosure is not limited thereto.

The fourth sub-ground rail 114 may branch off from the third sub-ground rail 113 and extend in the second direction DR2. The fourth sub-ground rail 114 may be disposed over the first cell region R1, the second cell region R2, and the comparison region R3. However, the present disclosure is not limited thereto. In some embodiments, the fourth sub-ground rail 114 may not be collinear with either the first sub-ground rail 111 or the second sub-ground rail 112. The fourth sub-ground rail 114 may be connected to the fifth ground pad VSP5 through the fifth ground via VSV5.

The fifth sub-ground rail 115 may extend in the second direction DR2 on the comparison region R3. The fifth sub-ground rail 115 may be spaced apart from the first sub-ground rail 111 in the second direction DR2. The fifth sub-ground rail 115 may cross the second search line SL2. However, the present disclosure is not limited thereto. The fifth sub-ground rail 115 may be connected to the third ground pad VSP3 through the third ground via VSV3.

The sixth sub-ground rail 116 may extend in the second direction DR2 on the comparison region R3. The sixth sub-ground rail 116 may be spaced apart from the second sub-ground rail 112 in the second direction DR2 and may be spaced apart from the fifth sub-ground rail 115 in the first direction DR1. The sixth sub-ground rail 116 may cross the second search line SL2. However, the present disclosure is not limited thereto. The sixth sub-ground rail 116 may be connected to the fourth ground pad VSP4 through the fourth ground via VSV4.

The seventh sub-ground rail 117 may extend in the first direction DR1 on the comparison region R3. The seventh sub-ground rail 117 may connect the fourth sub-ground rail 114, the fifth sub-ground rail 115, and the sixth sub-ground rail 116 to one another. The seventh sub-ground rail 117 may overlap the second search line SL2 in the third direction DR3. However, the present disclosure is not limited thereto.

Referring to FIGS. 8 and 11, the first to third word lines WL1 to WL3 may be disposed in a third metal level LV3. The third metal level LV3 may be located on the second metal level LV2 illustrated in FIG. 10.

The first word line WL1 may extend in the second direction DR2 on the second cell region R2 and the comparison region R3. The first word line WL1 may cross the third sub-ground rail 113 and the seventh sub-ground rail 117. However, the present disclosure is not limited thereto. The first word line WL1 may be connected to the seventh word line pad WLP7 through the seventh word line via WLV7. In addition, the first word line WL1 may be connected to the ninth word line pad WLP9 through the ninth word line via WLV9.

The second word line WL2 may extend in the second direction DR2 on the first cell region R1, the second cell region R2, and the comparison region R3. The second word line WL2 may be spaced apart from the first word line WL1 in the first direction DR1. The second word line WL2 may cross the third sub-ground rail 113 and the seventh sub-ground rail 117. The second word line WL2 may overlap the fourth sub-ground rail 114 in the third direction DR3. However, the present disclosure is not limited thereto. The second word line WL2 may be connected to the tenth word line pad WLP10 through the tenth word line via WLV10.

The third word line WL3 may extend in the second direction DR2 on the first cell region R1 and the comparison region R3. The third word line WL3 may be spaced apart from the second word line WL2 in the first direction DR1. The third word line WL3 may cross the third sub-ground rail 113 and the seventh sub-ground rail 117. However, the present disclosure is not limited thereto. The third word line WL3 may be connected to the sixth word line pad WLP6 through the sixth word line via WLV6. In addition, the third word line WL3 may be connected to the eighth word line pad WLP8 through the eighth word line via WLV8.

A first width d1 of the first word line WL1 in the first direction DR1 may be greater than a second width d2 of the second word line WL2 in the first direction DR1. In addition, a third width d3 of the third word line WL3 in the first direction DR1 may be greater than the second width d2 of the second word line WL2 in the first direction DR1. In this case, for example, the first width d1 of the first word line WL1 in the first direction DR1 may be the same as the third width d3 of the third word line WL3 in the first direction DR1. However, the present disclosure is not limited thereto.

In the semiconductor device according to some example embodiments of the present disclosure, the first ground rail 110 disposed in the second metal level LV2 is formed in a mesh shape and thus a degree of integration may be improved.

Hereinafter, a semiconductor device according to some other example embodiments of the present disclosure will be described with reference to FIG. 12. A difference between the semiconductor device illustrated in FIG. 12 and the semiconductor device illustrated in FIGS. 1 to 11 will mainly be described.

Figure 12:
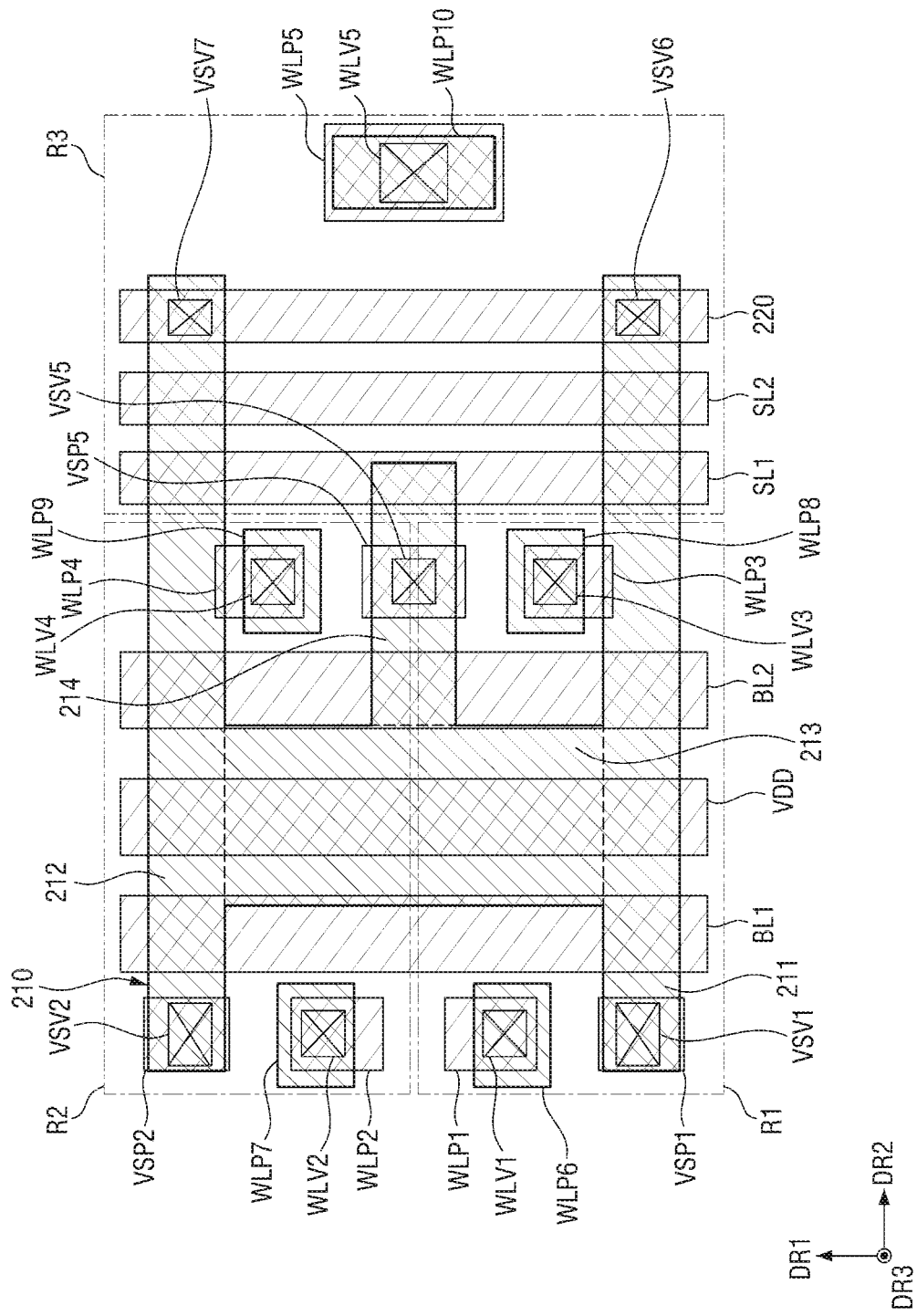
FIGS. 12 to 17 are views for describing semiconductor devices according to some other example embodiments of the present disclosure.

FIG. 12 is a view for describing a semiconductor device according to some other example embodiments of the present disclosure.

Referring to FIG. 12, in the semiconductor device according to some other example embodiments of the present disclosure, a first ground rail 210 may be disposed in a second metal level LV2 and a second ground rail 220 may be disposed on a first metal level LV1.

The second ground rail 220 may extend in a first direction DR1 on a comparison region R3 and may be spaced apart from a second search line SL2 in a second direction DR2. The first ground rail 210 may include first to fourth sub-ground rails 211 to 214.

The first sub-ground rail 211 may extend in the second direction DR2 on a first cell region R1 and the comparison region R3. The first sub-ground rail 211 may cross each of a first bit line BL1, a power rail VDD, a second bit line BL2, a first search line SL1, the second search line SL2, and the second ground rail 220. However, the present disclosure is not limited thereto. The first sub-ground rail 211 may be connected to a first ground pad VSP1 through a first ground via VSV1. In addition, the first sub-ground rail 211 may be connected to the second ground rail 220 through a sixth ground via VSV6.

The second sub-ground rail 212 may extend in the second direction DR2 on a second cell region R2 and the comparison region R3. The second sub-ground rail 212 may be spaced apart from the first sub-ground rail 211 in the first direction DR1. The second sub-ground rail 212 may cross each of the first bit line BL1, the power rail VDD, the second bit line BL2, the first search line SL1, the second search line SL2, and the second ground rail 220. However, the present disclosure is not limited thereto. The second sub-ground rail 212 may be connected to a second ground pad VSP2 through a second ground via VSV2. In addition, the second sub-ground rail 212 may be connected to the second ground rail 220 through a seventh ground via VSV7.

The third sub-ground rail 213 may extend in the first direction DR1 over the first and second cell regions R1 and R2. The third sub-ground rail 213 may connect the first sub-ground rail 211 to the second sub-ground rail 212.

The fourth sub-ground rail 214 may branch off from the third sub-ground rail 213 and extend in the second direction DR2. The fourth sub-ground rail 214 may be disposed over the first cell region R1, the second cell region R2, and the comparison region R3.

Hereinafter, a semiconductor device according to some other example embodiments of the present disclosure will be described with reference to FIG. 13. A difference between the semiconductor device illustrated in FIG. 13 and the semiconductor device illustrated in FIGS. 1 to 11 will mainly be described.

Figure 13:
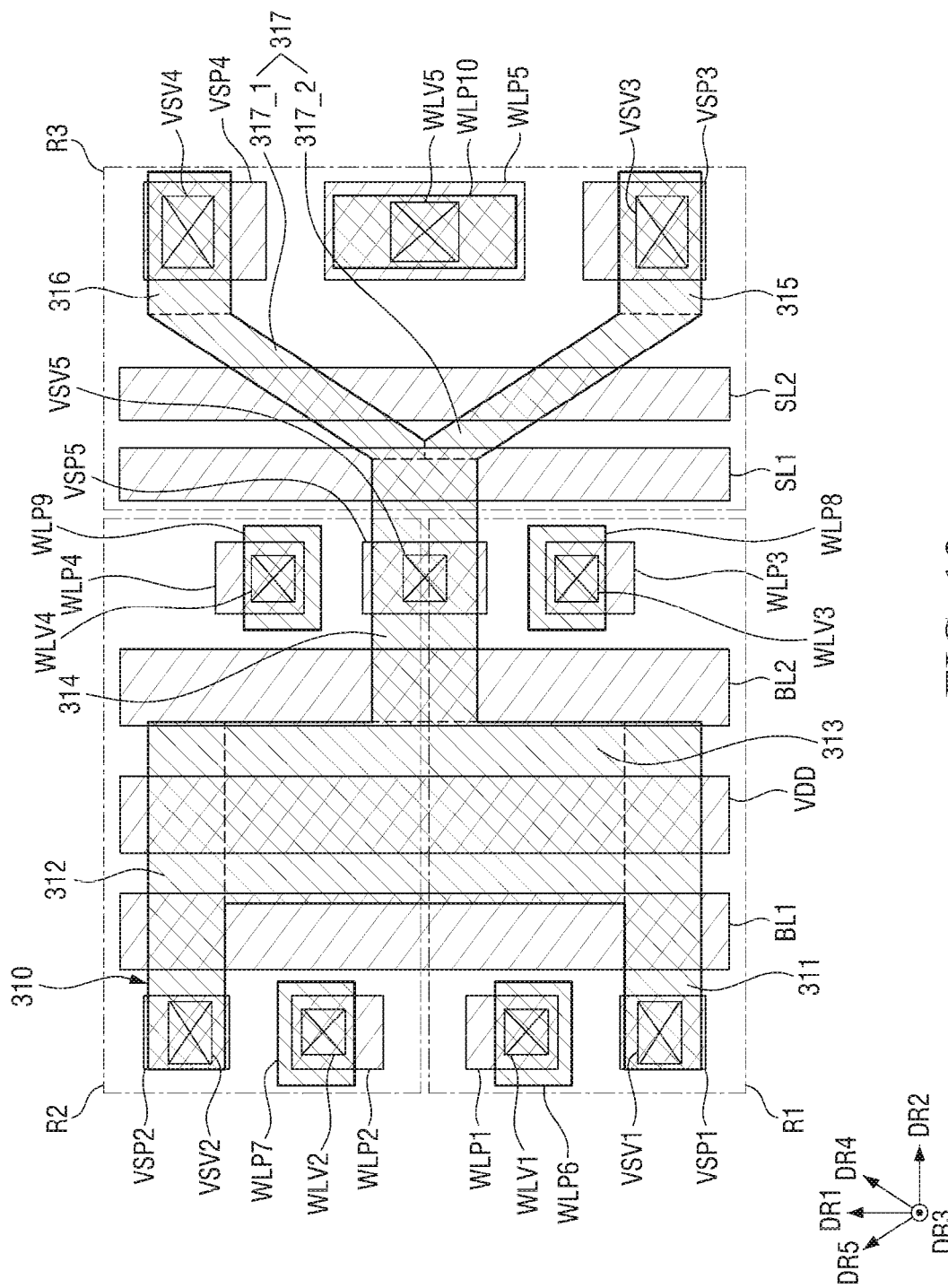

FIG. 13 is a view for describing a semiconductor device according to some other example embodiments of the present disclosure.

Referring to FIG. 13, in the semiconductor device according to some other example embodiments of the present disclosure, a first ground rail 310 may include first to seventh sub-ground rails 311 to 317.

The first sub-ground rail 311 may extend in a second direction DR2 on a first cell region R1. The first sub-ground rail 311 may cross a first bit line BL1 and a power rail VDD. The second sub-ground rail 312 may extend in the second direction DR2 on a second cell region R2. The second sub-ground rail 312 may be spaced apart from the first sub-ground rail 311 in a first direction DR1. The second sub-ground rail 312 may cross the first bit line BL1 and the power rail VDD. The third sub-ground rail 313 may extend in the first direction DR1 over the first and second cell regions R1 and R2. The third sub-ground rail 313 may connect the first sub-ground rail 311 to the second sub-ground rail 312. The third sub-ground rail 313 may overlap the power rail VDD in a third direction DR3.

The fourth sub-ground rail 314 may branch off from the third sub-ground rail 313 and extend in the second direction DR2. The fourth sub-ground rail 314 may be disposed over the first cell region R1, the second cell region R2, and the comparison region R3. The fifth sub-ground rail 315 may extend in the second direction DR2 on a comparison region R3. The fifth sub-ground rail 315 may be spaced apart from the first sub-ground rail 311 in the second direction DR2. In some embodiments, the fifth sub-ground rail 315 may be on and/or cross a second search line SL2. The sixth sub-ground rail 316 may extend in the second direction DR2 on the comparison region R3. The sixth sub-ground rail 316 may be spaced apart from the second sub-ground rail 312 in the second direction DR2 and may be spaced apart from the fifth sub-ground rail 315 in the first direction DR1. In some embodiments, the sixth sub-ground rail 316 may be on and/or cross the second search line SL2.

The seventh sub-ground rail 317 may connect the fourth sub-ground rail 314 to each of the fifth sub-ground rail 315 and the sixth sub-ground rail 316 on the comparison region R3. The seventh sub-ground rail 317 may include a first portion 317_1 and a second portion 317_2. The first portion 317_1 of the seventh sub-ground rail 317 may extend in a fourth direction DR4 different from the first and second directions DR1 and DR2 and connect the fourth sub-ground rail 314 to the sixth sub-ground rail 316. The second portion 317_2 of the seventh sub-ground rail 317 may extend in a fifth direction DR5 different from the first, second, and fourth directions DR1, DR2, and DR4 and connect the fourth sub-ground rail 314 to the fifth sub-ground rail 315.

Hereinafter, a semiconductor device according to some other example embodiments of the present disclosure will be described with reference to FIG. 14. A difference between the semiconductor device illustrated in FIG. 14 and the semiconductor device illustrated in FIGS. 1 to 11 will mainly be described.

Figure 14:
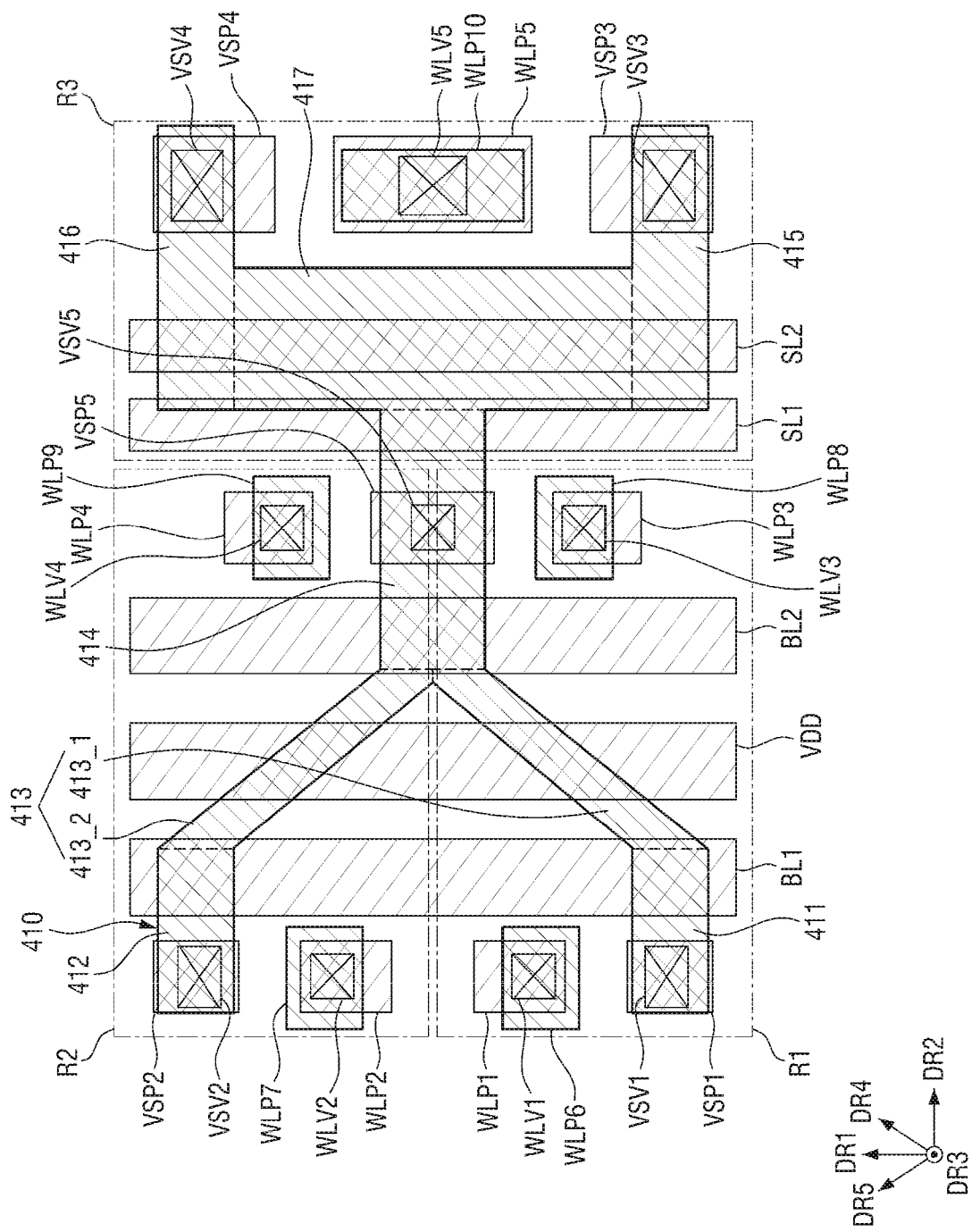

FIG. 14 is a view for describing a semiconductor device according to some other example embodiments of the present disclosure.

Referring to FIG. 14, in the semiconductor device according to some other example embodiments of the present disclosure, a first ground rail 410 may include first to seventh sub-ground rails 411 to 417.

The first sub-ground rail 411 may extend in a second direction DR2 on a first cell region R1. The first sub-ground rail 411 may be on and/or cross a first bit line BL1. The second sub-ground rail 412 may extend in the second direction DR2 on a second cell region R2. The second sub-ground rail 412 may be spaced apart from the first sub-ground rail 411 in a first direction DR1. The second sub-ground rail 412 may be on and/or cross the first bit line BL1.

The third sub-ground rail 413 may connect the first sub-ground rail 411 and the second sub-ground rail 412 to the fourth sub-ground rail 414 on the first and second cell regions R1 and R2. The third sub-ground rail 413 may include a first portion 413_1 and a second portion 413_2. The first portion 413_1 of the third sub-ground rail 413 may extend in a fourth direction DR4 and connect the first sub-ground rail 411 to the fourth sub-ground rail 414. The second portion 413_2 of the third sub-ground rail 413 may extend in a fifth direction DR5 and connect the second sub-ground rail 412 to the fourth sub-ground rail 414.

The fourth sub-ground rail 414 may branch off from the third sub-ground rail 413 and extend in the second direction DR2. The fourth sub-ground rail 414 may be disposed over the first cell region R1, the second cell region R2, and the comparison region R3. The fifth sub-ground rail 415 may extend in the second direction DR2 on a comparison region R3. The fifth sub-ground rail 415 may be spaced apart from the first sub-ground rail 411 in the second direction DR2. The fifth sub-ground rail 415 may cross a second search line SL2. The sixth sub-ground rail 416 may extend in the second direction DR2 on the comparison region R3. The sixth sub-ground rail 416 may be spaced apart from the second sub-ground rail 412 in the second direction DR2 and spaced apart from the fifth sub-ground rail 415 in the first direction DR1. The sixth sub-ground rail 416 may cross the second search line SL2. The seventh sub-ground rail 417 may extend in the first direction DR1 on the comparison region R3. The seventh sub-ground rail 417 may connect the fourth sub-ground rail 414, the fifth sub-ground rail 415, and the sixth sub-ground rail 416 to one another. The seventh sub-ground rail 417 may overlap the second search line SL2 in a third direction DR3.

Hereinafter, a semiconductor device according to some other example embodiments of the present disclosure will be described with reference to FIG. 15. A difference between the semiconductor device illustrated in FIG. 15 and the semiconductor device illustrated in FIGS. 1 to 11 will mainly be described.

Figure 15:
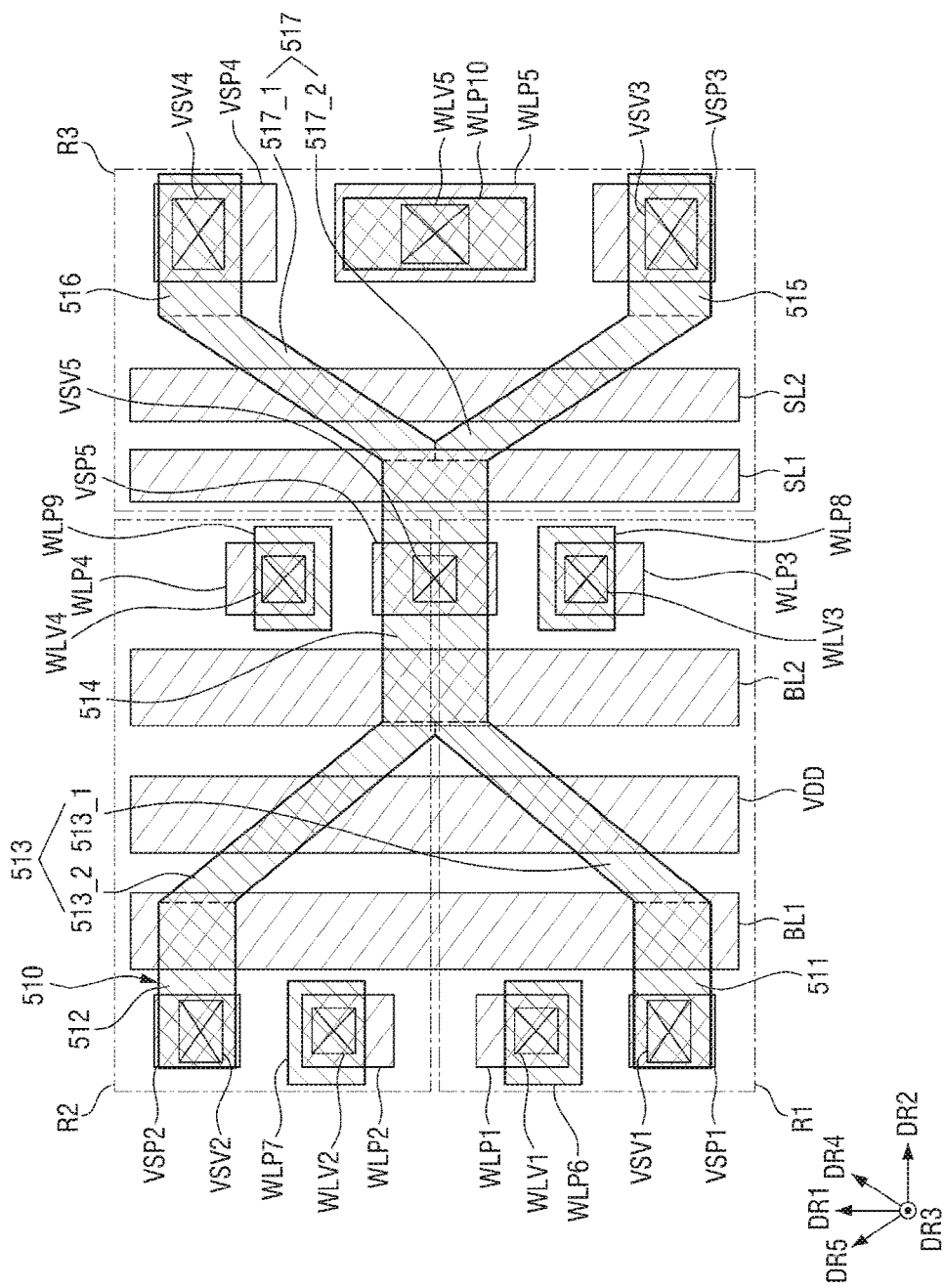

FIG. 15 is a view for describing a semiconductor device according to some other example embodiments of the present disclosure.

Referring to FIG. 15, in the semiconductor device according to some other example embodiments of the present disclosure, a first ground rail 510 may include first to seventh sub-ground rails 511 to 517.

The first sub-ground rail 511 may extend in a second direction DR2 on a first cell region R1. The first sub-ground rail 511 may be on and/or cross a first bit line BL1. The second sub-ground rail 512 may extend in the second direction DR2 on a second cell region R2. The second sub-ground rail 512 may be spaced apart from the first sub-ground rail 511 in a first direction DR1. The second sub-ground rail 512 may be on and/or cross the first bit line BL1.

The third sub-ground rail 513 may connect the first sub-ground rail 511 and the second sub-ground rail 512 to the fourth sub-ground rail 514 on the first and second cell regions R1 and R2. The third sub-ground rail 513 may include a first portion 513_1 and a second portion 513_2. The first portion 513_1 of the third sub-ground rail 513 may extend in a fourth direction DR4 and connect the first sub-ground rail 511 to the fourth sub-ground rail 514. The second portion 513_2 of the third sub-ground rail 513 may extend in a fifth direction DR5 and connect the second sub-ground rail 512 to the fourth sub-ground rail 514.

The fourth sub-ground rail 514 may branch off from the third sub-ground rail 513 and extend in the second direction DR2. The fourth sub-ground rail 514 may be disposed over the first cell region R1, the second cell region R2, and a comparison region R3. The fifth sub-ground rail 515 may extend in the second direction DR2 on the comparison region R3. The fifth sub-ground rail 515 may be spaced apart from the first sub-ground rail 511 in the second direction DR2. The sixth sub-ground rail 516 may extend in the second direction DR2 on the comparison region R3. The sixth sub-ground rail 516 may be spaced apart from the second sub-ground rail 512 in the second direction DR2 and may be spaced apart from the fifth sub-ground rail 515 in the first direction DR1.

The seventh sub-ground rail 517 may connect the fourth sub-ground rail 514 to the fifth sub-ground rail 515 and the sixth sub-ground rail 516 on the comparison region R3. The seventh sub-ground rail 517 may include a first portion 517_1 and a second portion 517_2. The first portion 517_1 of the seventh sub-ground rail 517 may extend in a fourth direction DR4 and connect the fourth sub-ground rail 514 to the sixth sub-ground rail 516. The second portion 517_2 of the seventh sub-ground rail 517 may extend in a fifth direction DR5 and connect the fourth sub-ground rail 514 to the fifth sub-ground rail 515.

Hereinafter, a semiconductor device according to some other example embodiments of the present disclosure will be described with reference to FIG. 16. A difference between the semiconductor device illustrated in FIG. 16 and the semiconductor device illustrated in FIGS. 1 to 11 will mainly be described.

Figure 16:
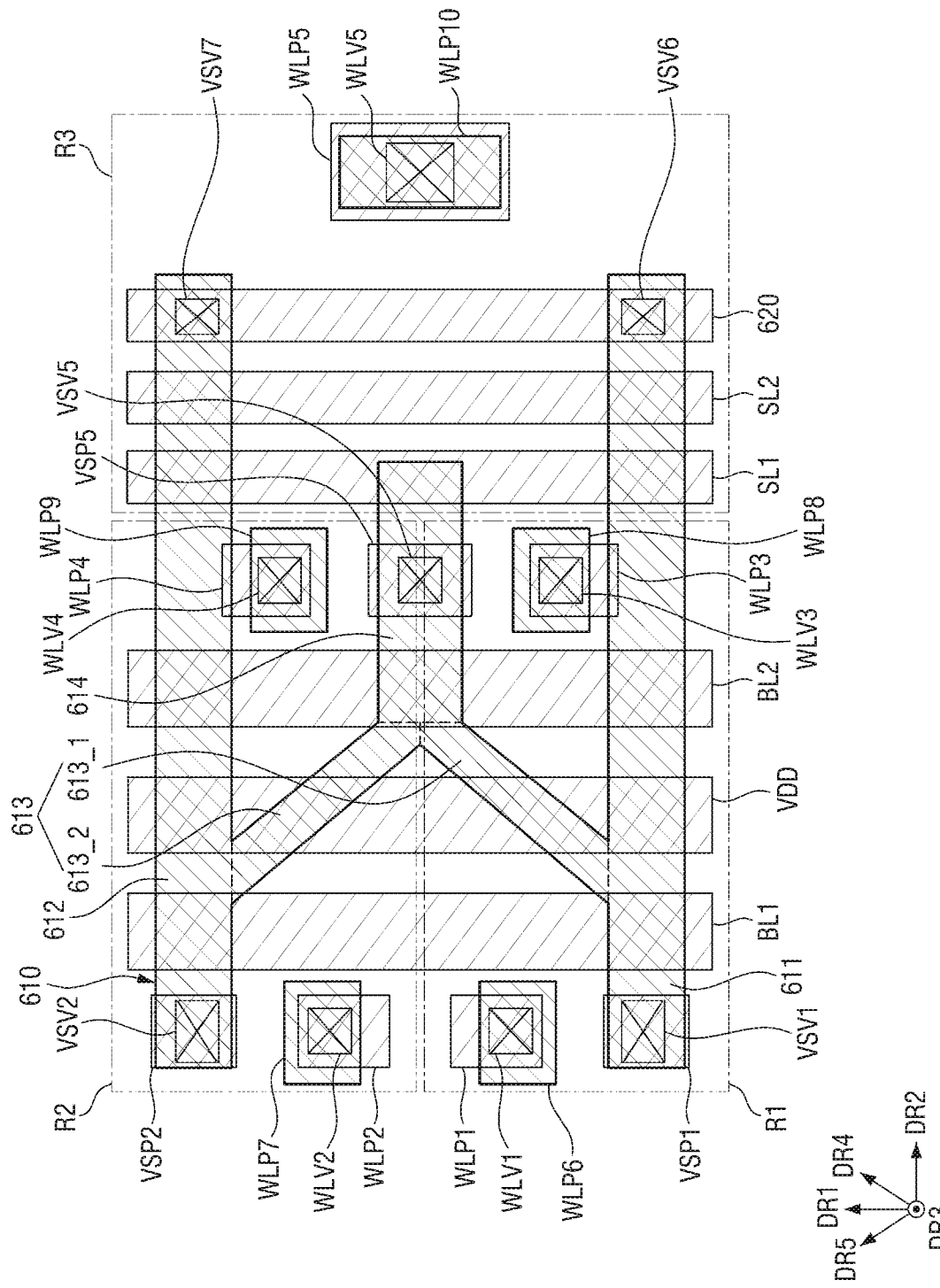

FIG. 16 is a view for describing a semiconductor device according to some other example embodiments of the present disclosure.

Referring to FIG. 16, in the semiconductor device according to some other example embodiments of the present disclosure, a first ground rail 610 may be disposed in a second metal level LV2 and a second ground rail 620 may be disposed on a first metal level LV1.

The second ground rail 620 may extend in a first direction DR1 on a comparison region R3 and may be spaced apart from a second search line SL2 in a second direction DR2. The first ground rail 610 may include first to fourth sub-ground rails 611 to 614.

The first sub-ground rail 611 may extend in the second direction DR2 on a first cell region R1 and the comparison region R3. The first sub-ground rail 611 may cross each of a first bit line BL1, a power rail VDD, the second bit line BL2, a first search line SL1, a second search line SL2, and the second ground rail 620.

The second sub-ground rail 612 may extend in the second direction DR2 on a second cell region R2 and the comparison region R3. The second sub-ground rail 612 may be spaced apart from the first sub-ground rail 611 in the first direction DR1. The second sub-ground rail 612 may cross each of the first bit line BL1, the power rail VDD, the second bit line BL2, the first search line SL1, the second search line SL2, and the second ground rail 620.

The third sub-ground rail 613 may connect the first sub-ground rail 611 and the second sub-ground rail 612 to the fourth sub-ground rail 614 on the first and second cell regions R1 and R2. The third sub-ground rail 613 may include a first portion 613_1 and a second portion 613_2. The first portion 613_1 of the third sub-ground rail 613 may extend in a fourth direction DR4 and connect the first sub-ground rail 611 to the fourth sub-ground rail 614. The second portion 613_2 of the third sub-ground rail 613 may extend in a fifth direction DR5 and connect the second sub-ground rail 612 to the fourth sub-ground rail 614.

The fourth sub-ground rail 614 may branch off from the third sub-ground rail 613 and extend in the second direction DR2. The fourth sub-ground rail 614 may be disposed over the first cell region R1, the second cell region R2, and the comparison region R3.

Hereinafter, a semiconductor device according to some other example embodiments of the present disclosure will be described with reference to FIG. 17. A difference between the semiconductor device illustrated in FIG. 17 and the semiconductor device illustrated in FIGS. 1 to 11 will mainly be described.

Figure 17:
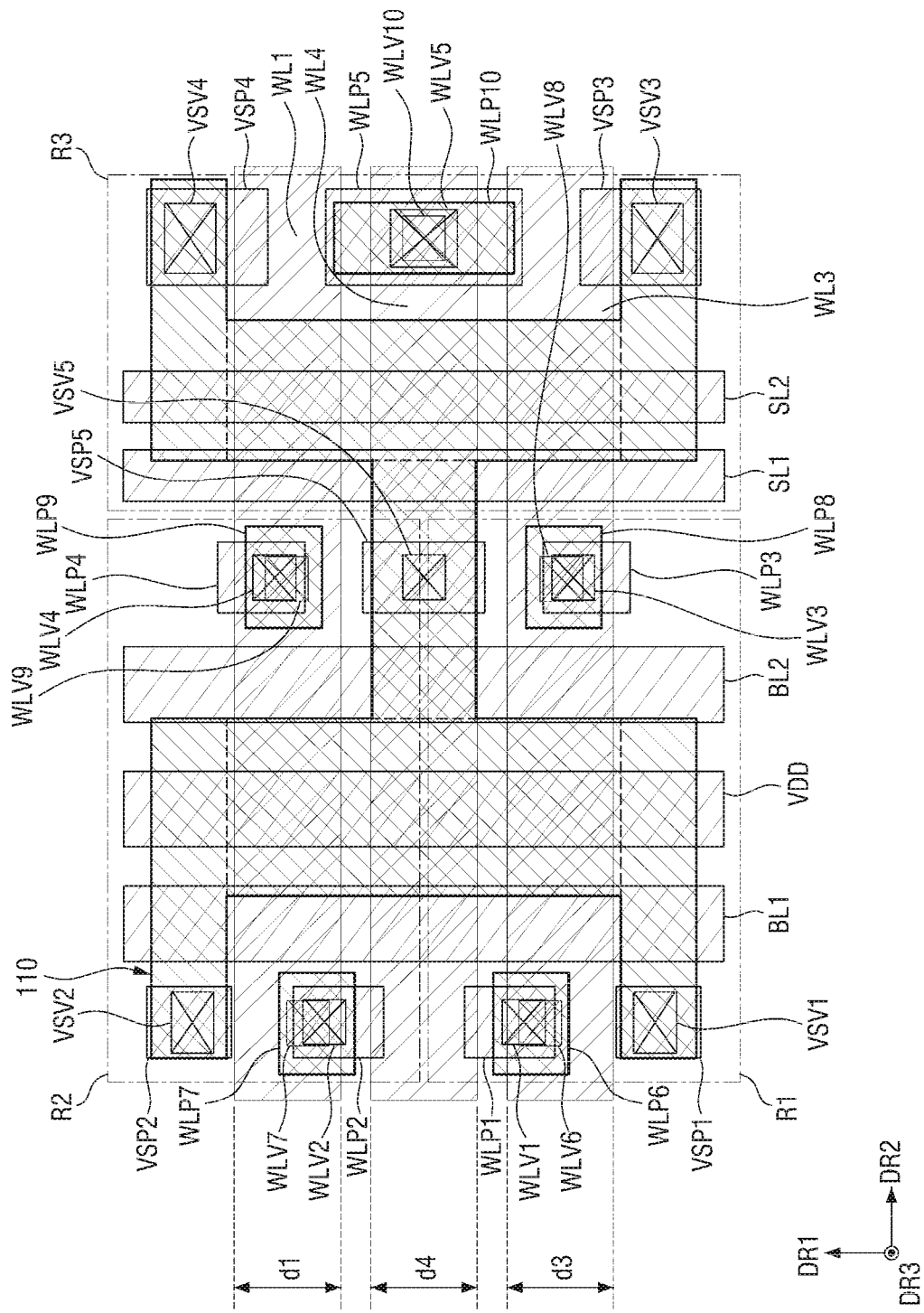

FIG. 17 is a view for describing a semiconductor device according to some other example embodiments of the present disclosure.

Referring to FIG. 17, in the semiconductor device according to some other example embodiments of the present disclosure, widths of first to third word lines WL1, WL4, and WL3 in a first direction DR1 may be the same as one another.

Specifically, a first width d1 of the first word line WL1 in the first direction DR1, a fourth width d4 of the second word line WL4 in the first direction DR1, and a third width d3 of the third word line WL3 in the first direction DR1 may be same as one another.

While the example embodiments of the present disclosure have been described with reference to the accompanying drawings, the present disclosure is not limited to the example embodiments disclosed herein but may be implemented in various different forms. It will be understood by those skilled in the art that various modifications can be made without departing from the scope of the present disclosure as defined by the following claims. Therefore, the above-described example embodiments should be considered in a descriptive sense only and not for purposes of limitation.

What is claimed is:

1. A semiconductor device comprising:
a substrate comprising a first cell region, a second cell region that is adjacent the first cell region in a first direction, and a comparison region that is adjacent the first and second cell regions in a second direction different from the first direction;
a bit line in a first metal level on the substrate, the bit line extending in the first direction; and
a first ground rail in a second metal level different from the first metal level,
wherein the first ground rail comprises a first sub-ground rail extending in the second direction on the first cell region,
a second sub-ground rail extending in the second direction on the second cell region,
a third sub-ground rail connecting the first sub-ground rail to the second sub-ground rail on the first and second cell regions, and
a fourth sub-ground rail that branches off from the third sub-ground rail and extends in the second direction.

2. The semiconductor device of claim 1, wherein the third sub-ground rail extends in the first direction.

3. The semiconductor device of claim 1, wherein the third sub-ground rail comprises:

a first portion extending in a third direction that is different from the first and second directions and connecting the first sub-ground rail to the fourth sub-ground rail; and a second portion extending in a fourth direction that is different from the first direction, the second direction, and the third direction and connecting the second sub-ground rail to the fourth sub-ground rail.

4. The semiconductor device of claim 1, wherein the first ground rail further comprises:
a fifth sub-ground rail extending in the second direction on the comparison region;
a sixth sub-ground rail extending in the second direction on the comparison region and spaced apart from the fifth sub-ground rail in the first direction; and
a seventh sub-ground rail connected to each of the fourth sub-ground rail, the fifth sub-ground rail, and the sixth sub-ground rail.

5. The semiconductor device of claim 4, wherein the seventh sub-ground rail extends in the first direction.

6. The semiconductor device of claim 4, wherein the seventh sub-ground rail comprises:
a first portion extending in a third direction that is different from the first and second directions and connecting the sixth sub-ground rail to the fourth sub-ground rail; and
a second portion extending in a fourth direction that is different from the first direction, the second direction, and the third direction and connecting the fifth sub-ground rail to the fourth sub-ground rail.

7. The semiconductor device of claim 1, further comprising a second ground rail in the first metal level on the comparison region and extending in the first direction.

8. The semiconductor device of claim 1, further comprising a first word line, a second word line, and a third word line in a third metal level that is at a different vertical level from the first and second metal levels, wherein the first word line, the second word line, and the third word line each extend in the second direction and are sequentially spaced apart from each other in the first direction, and
wherein a first width of the first word line in the first direction is greater than a second width of the second word line in the first direction.

9. The semiconductor device of claim 8, wherein the first width of the first word line in the first direction is equal to a third width of the third word line in the first direction.

10. The semiconductor device of claim 1, further comprising a first word line, a second word line, and a third word line in a third metal level that is at a different vertical level from the first and second metal levels, wherein the first word line, the second word line, and the third word line each extend in the second direction and are sequentially spaced apart from each other in the first direction, and
wherein a first width of the first word line in the first direction, a second width of the second word line in the first direction, and a third width of the third word line in the first direction are equal to each other.

11. The semiconductor device of claim 1, further comprising:
a first nanowire and a second nanowire that extend in the first direction and are stacked on the substrate to be sequentially spaced apart from each other; and
a gate electrode extending in the second direction and surrounding each of the first and second nanowires.

12. A semiconductor device comprising:
a substrate comprising a first cell region and a second cell region that is adjacent the first cell region in a first direction;
a first nanowire and a second nanowire that extend in the first direction and are stacked on the substrate to be sequentially spaced apart from each other;
a gate electrode extending in a second direction different from the first direction and surrounding each of the first and second nanowires;
a bit line in a first metal level on the substrate, the bit line extending in the first direction; and
a first ground rail in a second metal level that is on the first metal level,
wherein the first ground rail comprises a first sub-ground rail extending in the second direction on the first cell region,
a second sub-ground rail extending in the second direction on the second cell region,
a third sub-ground rail that is on the first and second cell regions and connects the first sub-ground rail to the second sub-ground rail, and
a fourth sub-ground rail that branches off from the third sub-ground rail and extends in the second direction.

13. The semiconductor device of claim 12, wherein the third sub-ground rail extends in the first direction.

14. The semiconductor device of claim 12, wherein the third sub-ground rail comprises:
a first portion extending in a third direction that is different from the first and second directions, the first portion connecting the first sub-ground rail to the fourth sub-ground rail; and
a second portion extending in a fourth direction that is different from the first direction, the second direction, and the third direction, the second portion connecting the second sub-ground rail to the fourth sub-ground rail.

15. The semiconductor device of claim 12, further comprising a comparison region that is adjacent the first and second cell regions in the second direction,
wherein the first ground rail further comprises:
a fifth sub-ground rail extending in the second direction on the comparison region;
a sixth sub-ground rail extending in the second direction on the comparison region and spaced apart from the fifth sub-ground rail in the first direction; and
a seventh sub-ground rail connected to each of the fourth sub-ground rail, the fifth sub-ground rail, and the sixth sub-ground rail.

16. The semiconductor device of claim 12, further comprising:
a comparison region that is adjacent the first and second cell regions in the second direction; and
a second ground rail in the first metal level and extending in the first direction.

17. The semiconductor device of claim 12, further comprising a first word line, a second word line, and a third word line in a third metal level on the second metal level, wherein the first word line, the second word line, and the third word line each extend in the second direction and are sequentially spaced apart from each other in the first direction,
wherein a first width of the first word line in the first direction is greater than a second width of the second word line in the first direction.

18. A semiconductor device comprising:
a substrate comprising a first cell region, a second cell region that is adjacent the first cell region in a first direction, and a comparison region that is adjacent the first and second cell regions in a second direction that is different from the first direction;

a first nanowire and a second nanowire that extend in the first direction and are stacked on the substrate to be sequentially spaced apart from each other;

a gate electrode extending in the second direction and surrounding each of the first and second nanowires;

a bit line in a first metal level on the substrate, the bit line extending in the first direction; and a first ground rail in a second metal level that is at a different vertical level from the first metal level, wherein the first ground rail comprises a first sub-ground rail extending in the second direction on the first cell region, a second sub-ground rail extending in the second direction on the second cell region, a third sub-ground rail extending in the first direction on the first and second cell regions and connecting the first sub-ground rail to the second sub-ground rail, and a fourth sub-ground rail that branches off from the third sub-ground rail and extends in the second direction.

19. The semiconductor device of claim 18, wherein the first ground rail further comprises:

a fifth sub-ground rail extending in the second direction on the comparison region;

a sixth sub-ground rail extending in the second direction on the comparison region and spaced apart from the fifth sub-ground rail in the first direction; and a seventh sub-ground rail connected to each of the fourth sub-ground rail, the fifth sub-ground rail, and the sixth sub-ground rail.

20. The semiconductor device of claim 19, wherein the seventh sub-ground rail comprises:

a first portion extending in a third direction that is different from the first and second directions and connecting the sixth sub-ground rail to the fourth sub-ground rail; and a second portion extending in a fourth direction that is different from the first direction, the second direction, and the third direction and connecting the fifth sub-ground rail to the fourth sub-ground rail.

* * * * *